United States Patent
Snyder et al.

(10) Patent No.: US 7,728,218 B2
(45) Date of Patent: Jun. 1, 2010

(54) HIGH EFFICIENCY THERMOELECTRIC POWER GENERATION USING ZINTL-TYPE MATERIALS

(75) Inventors: G. Jeffrey Snyder, Altadena, CA (US); Franck Gascoin, Buron Saint-Contest (FR); Shawna Brown, Sacramento, CA (US); Susan Kauzlarich, Davis, CA (US)

(73) Assignees: California Institute of Technology, Pasadena, CA (US); The Regents of th University of California, Oakland, CA (US)

(*) Notice: Subject to any disclaimer, the term of this patent is extended or adjusted under 35 U.S.C. 154(b) by 890 days.

(21) Appl. No.: 11/470,998

(22) Filed: Sep. 7, 2006

(65) Prior Publication Data

US 2007/0095382 A1 May 3, 2007

Related U.S. Application Data

(60) Provisional application No. 60/715,345, filed on Sep. 7, 2005, provisional application No. 60/740,495, filed on Nov. 29, 2005.

(51) Int. Cl.
*H01L 35/20* (2006.01)
*H01L 35/12* (2006.01)

(52) U.S. Cl. .................. 136/240; 136/236.1

(58) Field of Classification Search ............... 136/201, 136/200, 240, 236.1
See application file for complete search history.

(56) References Cited

OTHER PUBLICATIONS

Toberer et al. "High thermoelectric efficiency in lantanum doped Yb1MnSb11" Applied Physics Letters 93 062110 Aug. 2008.*
Brown et al. "Yb14MnSb11:New High Efficiency Thermoelectric Material for Power Generation" Chemistry Materials 18, 1873-1877, Mar. 2006.*
Chan et al. "Structure and Ferromagnetism of Rare Earth Zintl Compounds: Yb14MnSb11 and Yb14MnBi11" Chemistry Materials, 10 3583-3588, Oct. 1998.*
Sales et al., "Transport, Magnetic and Thermodynamic Properties of Doped and Undoped Yb14MnSb11 Crystals" March Meeting Abstract, American Physical Society, Mar. 2005.*

* cited by examiner

*Primary Examiner*—Jeffrey T Barton
*Assistant Examiner*—Devina Pillay
(74) *Attorney, Agent, or Firm*—Seth D. Levy; Davis Wright Tremaine LLP

(57) ABSTRACT

The invention disclosed herein relates to thermoelectrically-active p-type Zintl phase materials as well as devices utilizing such compounds. Such thermoelectric materials and devices may be used to convert thermal energy into electrical energy, or use electrical energy to produce heat or refrigeration. Embodiments of the invention relate to p-type thermoelectric materials related to the compound $Yb_{14}MnSb_{11}$.

2 Claims, 24 Drawing Sheets

HIGH EFFICIENCY THERMOELECTRIC POWER GENERATION USING ZINTL-TYPE MATERIALS

This application claims the benefit of priority from U.S. Provisional Application Ser. No. 60/715,345, filed Sep. 7, 2005 and U.S. Provisional Application Ser. No. 60/740,495, filed Nov. 29, 2005.

GOVERNMENT RIGHTS

The invention described herein was made in the performance of work under a NASA contract (contract No. 101971/4KJ05), and is subject to the provisions of Public Law 96-517 (35 USC 202) in which the Contractor has elected to retain title. In addition, this work was supported by the Jet Propulsion Laboratory (JPL 1261226) and the NSF (DMR-0120990).

FIELD OF THE INVENTION

The invention relates to the field of thermoelectric materials; more specifically, to the use of the Zintl materials such as $Yb_{14}MnSb_{11}$, for high-temperature thermoelectric applications.

BACKGROUND

Thermoelectric materials are a class of materials that efficiently convert thermal energy to electrical energy (Seebeck effect) and vice versa (Peltier effect). The "Seebeck effect" is the phenomenon underlying the conversion of heat energy into electrical power and is used in thermoelectric power generation. The "Peltier effect" is the opposite the Seebeck effect and is phenomenon in which heat absorption accompanies the passage of current through the junction of two dissimilar materials. The Peltier effect is used in thermoelectric refrigeration and other cooling applications. In addition, thermoelectric materials are used in heating applications and thermoelectric sensing devices.

Only certain materials have been found usable for the Seebeck and Peltier effect to be observed. Some thermoelectric materials are semiconducting or semi-metallic. Such materials conduct electricity by using two types of carriers: electrons and holes. When one atom in a crystal is replaced by another atom with more valence electrons, the extra electrons from the substituting atom are not needed for bonding and can move around throughout the crystal. A semiconductor is called n-type if the conducting carriers are electrons. On the other hand, if an atom in the crystal is replaced with an another different atom having fewer valence electrons, one or more bonds are left vacant and thus positively charged "holes" are produced. A semiconductor is called p-type if the conducting carriers are holes. In the above-mentioned thermoelectric devices, both n-type and p-type thermoelectric materials are typically needed. Samples of n-type and p-type semiconductor materials used in thermoelectric devices are often referred to as "n-legs" and "p-legs".

Devices made from thermoelectric materials are environmentally benign power sources that may provide a solution to today's energy problems. These devices convert thermal energy directly into electrical energy, can utilize waste heat, require minimal maintenance and can be segmented to operate over a large temperature range (300-1275 K), thus, they carry the potential of assisting the efforts to maintain and protect the environment. An electric power generator based on thermoelectric materials does not use moving parts like conventional power generators. This feature significantly enhances the reliability of the thermoelectric devices by avoiding mechanical wear of moving parts and corresponding failure. Thermoelectric devices may aid in the elimination of chlorofluorocarbons, which are used in most compressor-based refrigerators, as well as the conversion of waste heat into beneficial electrical power, for example, containing the heat produced from an automobile's engine or exhaust system and converting it into auxiliary power. Such devices allow operations in hostile environments such as in high temperature conditions (e.g., 1173 K) without human attendance. In addition, these devices have the potential of providing a power source that may outperform batteries. Overall, thermoelectric modules may be an asset for countless applications, many that would be of interest to automotive companies, appliance manufacturers, NASA, and the armed forces.

To determine the thermoelectric efficiency of a thermoelectric device, there are two primary parameters that govern performance; the temperature difference ($\Delta T = T_h - T_c$) across the module and the thermoelectric figure of merit (zT) of the materials. The temperature difference between the hot ($T_h$) and cold ($T_c$) sides of a thermoelectric device sets the upper limits of efficiency through the Carnot efficiency, $\eta_c = \Delta T/T_h$ (G. J. Snyder, *Applied Physics Letters* 84:2436-2438, 2004). The materials segmented in the n- and p-legs of the device determine how close the efficiency can be to the Carnot maximum through zT. Here, $zT = \alpha^2 T/\rho \kappa_T$ ($\alpha$: Seebeck coefficient ($\mu V/K$), T: temperature (K), $\rho$: electrical resistivity (mOhms cm), $\kappa_T$: thermal conductivity (mW/cm-K)) (F. J. DiSalvo, *Science*, Washington, D.C. 285:703-706, 1999). In addition, when segmenting materials for high efficiency, large temperature difference applications, the thermoelectric compatibility factors ($s = [(1+zT)^{1/2} - 1]/\alpha T$) of the materials need to be similar (G. J. Snyder, *Applied Physics Letters* 84:2436-2438, 2004).

Good thermoelectric compounds are those that result in low electrical resistivity and thermal conductivity values and large Seebeck coefficient values (F. J. DiSalvo, *Science*, Washington, D.C. 285:703-706, 1999). It has been observed that typically small band-gap, semiconducting materials with carrier concentrations within the $10^{19}$-$10^{21}$ cm$^{-3}$ range work better than metallic or insulating materials (G. Mahan et al., *Physics Today* 50:42-47, 1997). In addition, a large unit cell, heavy atoms, and structural complexity are also predicted to result in low thermal conductivity and therefore high thermoelectric efficiency.

State of the art thermoelectric devices are typically based on $Bi_2Te_3$—$Sb_2Te_3$ alloys for room temperature applications and PbTe or GeTe based compounds for power generation applications up to about 500° C. Silicides such as $FeSi_2$ and SiGe, which are current state of the art thermoelectric conversion materials for high temperatures (above 873 K), have a low figure of merit (zT) ($FeSi_2$=0.2 or less; p-SiGe zT=0.6) (C. Wood, *Energy Conversion and Management* 24:331-43, 1984; 0. Yamashita and N. Sadatomi, *Journal of Applied Physics* 88:245-251, 2000).

Other materials that may be useful for thermoelectric applications include intermetallic clathrates, complex chalcogenides, half-Heusler alloys and antimonide skutterudites (N. L. Okamoto et al., *Materials Research Society Symposium Proceedings* 793:187-192, 2004; B. C. Sales et al., *Science*, Washington, D.C. 272:1325-1328, 1996; S. W. Kim et al., *Science and Technology of Advanced Materials* 5:485-489, 2004; D. Bilc et al., *Physical Review Letters* 93:146403/1-146403/4, 2004), as well as super-lattice thin film structures such as $Bi_2Te_3/Sb_2Te_3$ and $PbSe_{0.98}Te_{0.02}/PbTe$ (R.

Venkatasubramanian, E. Siivola et al., *Nature* 413:597-602, 2001; T. C. Harman et al., *Journal of Electronic Materials* 25: 1121-1127, 1996; H. Beyer et al., *Applied Physics Letters* 80, 1216-1218, 2002). However, out of the numerous compounds achieving breakthrough figures of merit, all these are in the room temperature to moderate temperature range of 300-900 K. Moreover, many thermoelectric applications require large quantities of material, making thin film systems an unrealistic option and bulk samples more desirable.

Based on the potential applications of thermoelectric materials, as well as the limitations of the current art, there is a significant need in the art for more efficient thermoelectric compounds and devices.

SUMMARY OF THE INVENTION

The invention disclosed herein relates to p-type thermoelectric compounds as well as thermoelectric devices utilizing such compounds. The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

An embodiment by way of non-limiting example include thermoelectric devices, comprising: a first substrate configured to operate at a first temperature; a second substrate configured to operate at a second temperature, said second temperature being different from said first temperature to form a temperature gradient across said first substrate and said second substrate; a p-type thermoelectric material disposed between said first substrate and said second substrate, said p-type thermoelectric material having a first end surface in thermal contact with said first substrate and a second end surface in thermal contact with said second substrate, said p-type thermoelectric material comprising a compound having the general formula (I)

$$A_{14}MPn_{11} \qquad (I),$$

wherein A is selected from the group consisting of calcium, strontium, barium, ytterbium, europium, lanthanum, and combinations thereof; M is selected from the group consisting of manganese, zinc, aluminum, gallium, indium, scandium, cobalt, chromium, nickel, iron, and combinations thereof; and Pn is selected from the elements nitrogen, phosphorus, arsenic, bismuth, antimony, gallium, germanium, tin, lead, selenium, tellurium, and combinations thereof; an n-type thermoelectric material disposed between said first substrate and said second substrate, said n-type thermoelectric material having a first end surface in thermal contact with said first substrate and a second end surface in thermal contact with said second substrate; an electrical conducting element to electrically connect said first surface of said p-type thermoelectric material with said first surface of said n-type thermoelectric material to provide a first electrical conduit therebetween; and an electrical circuit, having a first terminal and a second terminal, said first terminal connecting to said second surface of said p-type thermoelectric material, said second terminal connecting to said second surface of said n-type thermoelectric material, to provide a second electrical conduit between said p-type thermoelectric material and said n-type thermoelectric material, whereby said p-type thermoelectric material, said electrically conducting element, said n-type thermoelectric material, and said electrical circuit form an electrical loop through which an electrical current may travel.

Further embodiments of the present invention relate to thermoelectric devices wherein said p-type thermoelectric material and said n-type thermoelectric material are configured to transfer thermal energy from said first substrate to said second substrate and to generate said electrical current in a direction from said n-type thermoelectric material to said p-type thermoelectric material.

Still further embodiments of the present invention relate to thermoelectric devices wherein said electrical circuit further comprises a DC power supply to drive said electrical current to flow in a direction from said n-type thermoelectric material to said p-type thermoelectric material.

Still further embodiments of the present invention include thermoelectric devices wherein said electrical circuit further comprises a DC power supply to drive said electrical current to flow in a direction from said p-type thermoelectric material to said n-type thermoelectric material.

Other embodiments of the present invention relate to thermoelectric devices wherein the p-type thermoelectric material, the n-type thermoelectric material, or both are segmented.

Still other embodiments of the present invention relate to thermoelectric devices wherein A is ytterbium, and/or wherein Pn is antimony.

Additional embodiments of the present invention relate to thermoelectric devices wherein the p-type thermoelectric material has the general formula (II)

$$Yb_{14-y}A'_yMn_{1-x}M'_xSb_{11} \qquad (II),$$

wherein A' is selected from the group consisting of calcium, europium, lanthanum, and combinations thereof; M' is selected from the group consisting of zinc, aluminum, and combinations thereof; y is from about 0.0 to about 14.0; and x is from about 0.0 to about 1.0.

Still further embodiments of the present invention relate to thermoelectric devices wherein the p-type thermoelectric material comprises a compound according to the general formula II $$Yb_{14}Mn_{1-x}Zn_xSb_{11} \qquad (III),$$

wherein x is from about 0.0 to about 1.0.

Additional embodiments of the present invention relate to thermoelectric devices wherein the p-type thermoelectric material comprises a compound according to the general formula IV $$Yb_{14}Mn_{1-x}Al_xSb_{11} \qquad (IV),$$

wherein x is from about 0.0 to about 1.0.

Additional embodiments of the present invention relate to thermoelectric devices wherein the p-type thermoelectric material comprises $Yb_{14}MnSb_{11}$ and/or $Yb_{14}ZnSb_{11}$.

Embodiments of the invention relate to thermoelectrically active p-type thermoelectric materials having the general formula (I):

$$A_{14}MPn_{11} \qquad (I),$$

wherein A is selected from the group consisting of calcium, strontium, barium, ytterbium, europium, lanthanum, and combinations thereof; M is selected from the group consisting of manganese, zinc, aluminum, gallium, indium, scandium, cobalt, chromium, nickel, iron, and combinations thereof; and Pn is selected from the elements nitrogen, phosphorus, arsenic, bismuth, antimony, gallium, germanium, tin, lead, selenium, tellurium, and combinations thereof.

Further embodiments of the invention relate to thermoelectrically active p-type thermoelectric materials wherein the thermoelectric material has a thermoelectric figure of merit (zT) of at least about 0.6 and a thermoelectric power generation compatibility factor (s) of at least about 1 V$^{-1}$, at a temperature above about 898 K.

Still further embodiments of the present invention include p-type thermoelectric materials wherein 1 to 10% by weight of the thermoelectric material is replaced by dopants, or wherein 0.05 to 1% by weight of the thermoelectric material is replaced by dopants.

Other embodiments of the invention relate to thermoelectrically active p-type thermoelectric materials wherein A is ytterbium and/or Pn is antimony.

Still other embodiments of the invention relate to a thermoelectrically active p-type thermoelectric material comprising the general formula (II):

$$Yb_{14-y}A'_yMn_{1-x}M'_xSb_{11} \quad (II),$$

wherein A' is selected from the group consisting of calcium, europium, lanthanum, and combinations thereof; M' is selected from the group consisting of zinc, aluminum, and combinations thereof; y is from about 0.0 to about 14.0; and x is from about 0.0 to about 1.0.

Still other embodiments of the invention relate to a thermoelectrically active p-type thermoelectric material wherein the thermoelectric material has a thermoelectric figure of merit (zT) of at least about 0.6 and a thermoelectric power generation compatibility factor (s) of at least about 1 V$^{-1}$, at a temperature above about 898 K.

Embodiments of the present invention relate to a p-type thermoelectric material, wherein the thermoelectric material has a thermoelectric figure of merit (zT) of at least 0.6 and a thermoelectric power generation compatibility factor (s) of at least 1, at a temperature above 898 K.

Embodiments of the invention relate to a method of producing an electrical current, comprising providing a thermoelectric device, comprising a first substrate configured to operate at a first temperature, a second substrate configured to operate at a second temperature, said second temperature being different from said first temperature to form a temperature gradient across said first substrate and said second substrate, a p-type thermoelectric material disposed between said first substrate and said second substrate, said p-type thermoelectric material having a first end surface in thermal contact with said first substrate and a second end surface in thermal contact with said second substrate, said p-type thermoelectric material comprising a compound having the general formula (I)

$$A_{14}MPn_{11} \quad (I),$$

wherein A is selected from the group consisting of calcium, strontium, barium, ytterbium, europium, lanthanum, and combinations thereof, M is selected from the group consisting of manganese, zinc, aluminum, gallium, indium, scandium, cobalt, chromium, nickel, iron, and combinations thereof, and Pn is selected from the elements nitrogen, phosphorus, arsenic, bismuth, antimony, gallium, germanium, tin, lead, selenium, tellurium, and combinations thereof; and operating the thermoelectric device to produce an electrical current.

In addition to the exemplary aspects and embodiments described above, further aspects and embodiments will become apparent by reference to the drawings and by study of the following detailed descriptions.

BRIEF DESCRIPTION OF DRAWINGS

Exemplary embodiments are illustrated in referenced figures of the drawings. It is intended that the embodiments and figures disclosed herein are to be considered illustrative rather than restrictive.

DETAILED DESCRIPTION

Figure 1:
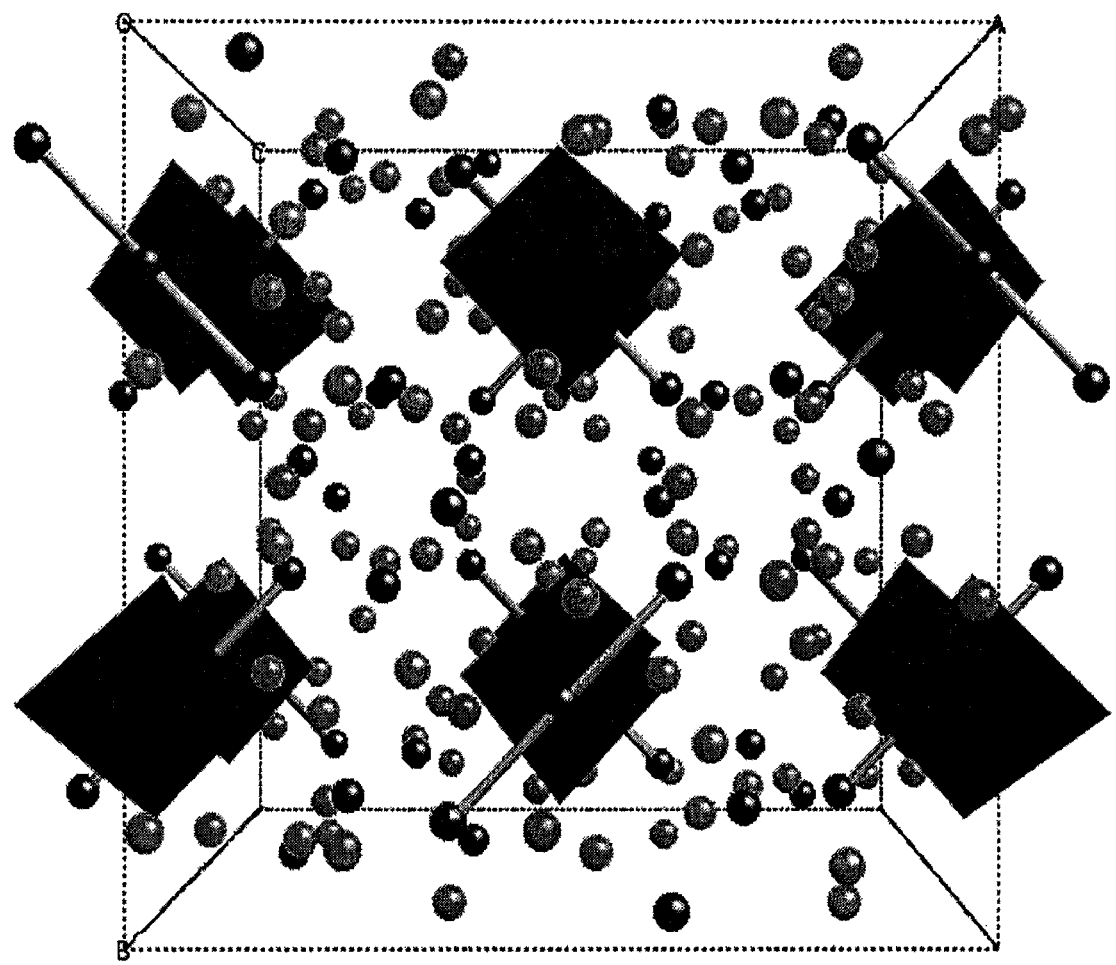
FIG. 1 shows I4$_{1/acd}$ crystal structure of Yb$_{14}$MnSb$_{11}$ in accordance with an embodiment of the present invention. The light grey balls, polyhedrons, and dark grey balls represent Yb, Mn, and Sb, respectively.

The present invention relates to thermoelectric materials and devices. More particularly, the present disclosure describes a class of thermoelectric semiconducting compounds and applications thereof for thermoelectric devices. The thermoelectric compounds described herein belong to the p-type family of semiconducting materials. Such materials may be used as a component of a thermoelectric device, along with an n-type semiconducting material.

Thermoelectric compounds useful for the applications described herein may be described by the general stoichiometric formula (I).

$$A_{14}MPn_{11} \quad (I)$$

"A" may comprise a number of elements, including alkaline earth elements and rare earth elements, which includes lanthanides. Examples of alkaline earth elements include beryllium (Be), magnesium (Mg), calcium (Ca), strontium (Sr), barium (Ba), and radium (Ra). Examples of rare earth elements include scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

"M" may comprise any transition or a main group element. Main group elements include aluminum (Al), boron (B), gallium (Ga), indium (In), silicon (Si), germanium (Ge), and tin (Sn). Transition elements (transition metals) comprise scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au), mercury (Hg), and actinium (Ac).

"Pn" may be an element from group 15, which comprises nitrogen (N), phosphorus (P), arsenic (As), antimony (Sb), and bismuth (Bi).

Pn may also be an isoelectronic or nearly isoelectronic mixture of elements from group 14, 15 and 16, such as alloys of antimony and bismuth, or replacing two antimony elements with germanium and tellurium. Group 14 comprises carbon (C), silicon (Si), germanium (Ge), tin (Sn), and lead (Pb). Group 15 comprises nitrogen (N), phosphorus (P), arsenic (As), antimony (Sb), and bismuth (Bi). Group 16 comprises oxygen (O), sulfur (S), selenium (Se), tellurium (Te), and polonium (Po).

Compounds of formula (I) are generally referred to herein as Zintl compounds, Zintl phase materials, or Zintl-type materials. Many Zintl phase materials fulfill the qualifications of good thermoelectric compounds (i.e., low electrical resistivity and thermal conductivity values and large Seebeck coefficient values), however relatively few have been investigated. Not only do Zintl phases form the requisite small band gap semiconductors with complex structures, but they also often contain cationic sites that allow tuning of the carrier concentration (and therefore the electronic properties) as well as additional disorder scattering (F. Gascoin et al., *Advanced Functional Materials* 15:1860-1864, 2005)

Zintl-type compounds such as those encompassed by formula (I) generally have the following properties: 1) are tetragonal; I4$_1$/acd, 2) have a Z=8, 3) have lattice parameters $(Å)^a$=a=~16 and c=~21, 4) have a cell volume $(Å^3)$=~6000, and/or 5) have a primary cell unit comprising 1 $[MPn_4]^{9-}$ tetrahedron, 1 $[Pn_3]^{7-}$ linear polyatomic anion, 4 $Pn^{3-}$ anions, and 14 $A^{2+}$ cations. In certain embodiments of the invention, the p-type thermoelectric materials suitable for the applications disclosed herein have a thermoelectric figure of merit (zT) of at least about 0.6 and a thermoelectric power generation compatibility factor (s) of at least about 1 $V^{-1}$, at a temperature above about 898 K.

An example of a Zintl compound specified by Formula I that may be useful for thermoelectric applications is the compound $Yb_{14}MnSb_{11}$. As disclosed herein, the use of Zintl phase $Yb_{14}MnSb_{11}$ doubles the conversion efficiency for segmented thermoelectric materials and improves the compatibility factor with various thermoelectric materials. The high zT shown in $Yb_{14}MnSb_{11}$ demonstrates that Zintl phases are a useful class of materials for thermoelectric applications. The maximum zT achieved from $Yb_{14}MnSb_{11}$ is 67% greater than that of SiGe. Further, the system may be further optimized due to the large variety of elements found with this structure type, and the complex structure with the variety of distinct structural units that should reduce lattice thermal conductivity.

$Yb_{14}MnSb_{11}$ is a material that stretches beyond the boundaries of a classical Zintl compound. Compounds included in the Zintl structure type are generally found to be electronically positioned between the class of intermetallics and insulating valence compounds (*Chemistry, Structure and Bonding of Zintl Phases and Ions.* S. M. Kauzlarich, Ed., VCH Publishers, New York, 1996), and are compounds considered to be valence precise and semiconducting (S. M. Kauzlarich, *Zintl Compounds.* B. R. King, Ed., Encyclopedia of Inorganic Chemistry 10, John Wiley & Sons, ed. 2, 2005). $Yb_{14}MnSb_{11}$ maintains valence precision; however, it is a ferromagnetic semimetal that follows Ruderman-Kittel-Kasuya-Yoshia (RKKY) theory, suggesting that it is an intermetallic. XMCD (A. P. Holm et al., *Journal of the American Chemical Society* 124:9894-9898, 2002) and XPS (A. P. Holm et al., *Journal of Solid State Chemistry* 178:262-269, 2005) measurements suggest that it should be considered a semimetal.

However, $Yb_{14}MnSb_{11}$ is isostructural to the Zintl phase, $Ca_{14}AlSb_{11}$, crystallizing in the body-centered tetragonal unit cell, space group $I4_1/acd$, with $Z=8$ (J. Y. Chan, et al., *Chemistry of Materials* 10:3583-3588, 1998; A. P. Holm et al., *Journal of Solid State Chemistry* 178:262-269, 2005). Each formula unit comprises one $[MnSb_4]^{9-}$ tetrahedron, a $[Sb_3]^{7-}$ polyatomic anion, four $Sb^{3-}$ anions, and 14 $Yb^{2+}$ cations (S. M. Kauzlarich, *Comments on Inorganic Chemistry* 10:75-88, 1990). In the Zintl extreme, these units are held together through ionic forces. For this semimetal intermetallic, clearly the bonding is more complex. FIG. 1 shows a perspective view of $Yb_{14}MnSb_{11}$ where the light grey balls, polyhedrons, and dark grey balls represent Yb, Mn, and Sb atoms, respectively. The $MnSb_4$ tetrahedron is shown as a filled polyhedron. The $Ca_{14}AlSb_{11}$ structure type can be more generally expressed as $A_{14} MPn_{11}$, where A is a heavy or alkaline earth metal, M is a transition or main group metal, and Pn is a pnicogen (as specified by formula I). This generalization allows for the potential to chemically tune the electronic and thermal properties of the system through doping onto the various sites. Doping on the cationic metal site, A, will allow for possible tuning of the carrier concentration and disorder scattering of phonons, while doping on the metal site, M, will enable possible tuning of the electronic parameters.

Figure 2:
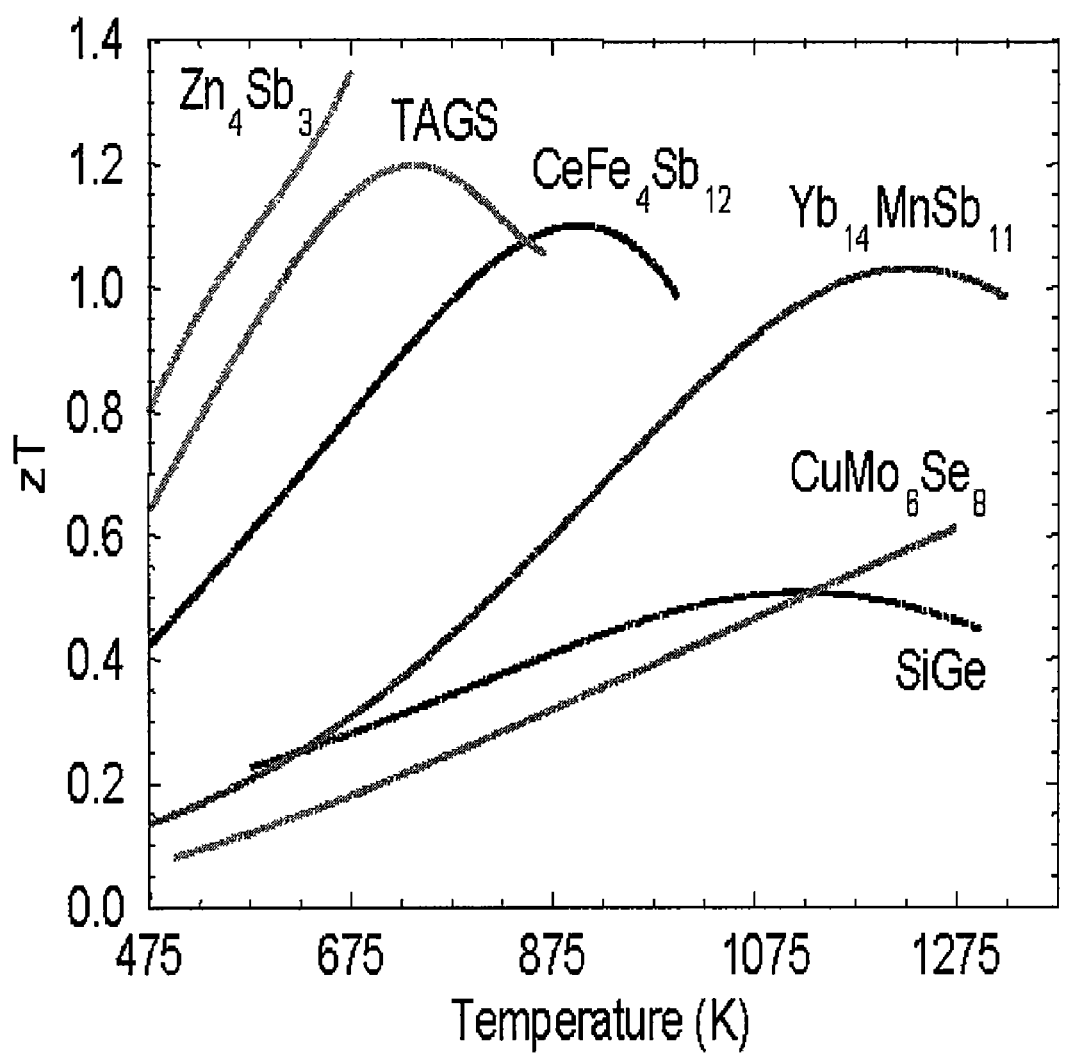
FIG. 2 shows a Figure of Merit comparison plot for competitive compounds in accordance with an embodiment of the present invention. [TAGS: (AgSbTe$_2$)$_{0.15}$(GeTe)$_{0.85}$].

As shown in FIG. 2, $Yb_{14}MnSb_{11}$ outperforms a number of p-type thermoelectric materials in the temperature range of 975-1275 K, making this system suitable for use in efficient high-temperature thermoelectric power generation. Potential applications include, but are in no way limited to, utilization of waste heat in aircraft or power plants, and powering a satellite for deep space exploration. With an average zT of 0.948, a hot side of 1275 K, and a cold side of 975 K, a thermal-to-electric efficiency of 4.3% can be achieved compared to 2.6% for p-SiGe. Segmenting $Yb_{14}MnSb_{11}$ with the p-skutterudite, $CeFe_4Sb_{12}$ over the temperature range of 775-1275 K significantly increases the efficiency to 7.3%, while that for $SiGe/CeFe_4Sb_{12}$, would be only 4.5%. As the cold side of the device is lowered to 300 K, the thermal-to-electric efficiency may improve further to a value of 18.6% with the following p-segmentation: $Yb_{14}MnSb_{11}/CeFe_4Sb_{12}/(GeTe)_{0.85}(AgSbTe_2)_{0.15}(TAGS)/(Bi,Sb)_2Te_3$. Additional enhancement of the p-leg zT may be possible through further doping studies of the A and M sites.

Overall, the bulk transition metal compound of $Yb_{14}MnSb_{11}$ has demonstrated stability at high temperatures (>1275 K), and exceptional thermoelectric properties. The largest high temperature (1275 K) figure of merit that has been measured thus far reaches a $zT\sim1.03$. Unlike the current state-of-the-art material, the compatibility factor of $Yb_{14}MnSb_{11}$ is within the acceptable "factor of two" range required for efficient performance of a segmented device.

The Zintl phase compounds herein may be doped in order to change its electronic properties. Doping refers to the process of intentionally introducing impurities into a pure semiconductor substrate. Certain embodiments of the invention relate to thermoelectric compounds that include substitution with additional elements allowing for modulation of thermoelectric properties. Such additional elements may be referred to as "dopants". Dopants may give the semiconductor an excess of conducting electrons, or an excess of conducting holes (or phonons). For example, Formula III, below specifies a family of compounds that may be obtained by "doping" $Yb_{14}MnSb_{11}$.

wherein A' is selected from the group consisting of calcium (Ca), europium (Eu), lanthanum (La), and combinations thereof; M' is selected from the group consisting of zinc (Zn), aluminum (Al), and combinations thereof; y is from about 0.0 to about 14.0; and x is from about 0.0 to about 1.0. Examples 4-6 below describe the analysis of a number of useful compounds relating to Formula II.

Figure 3:
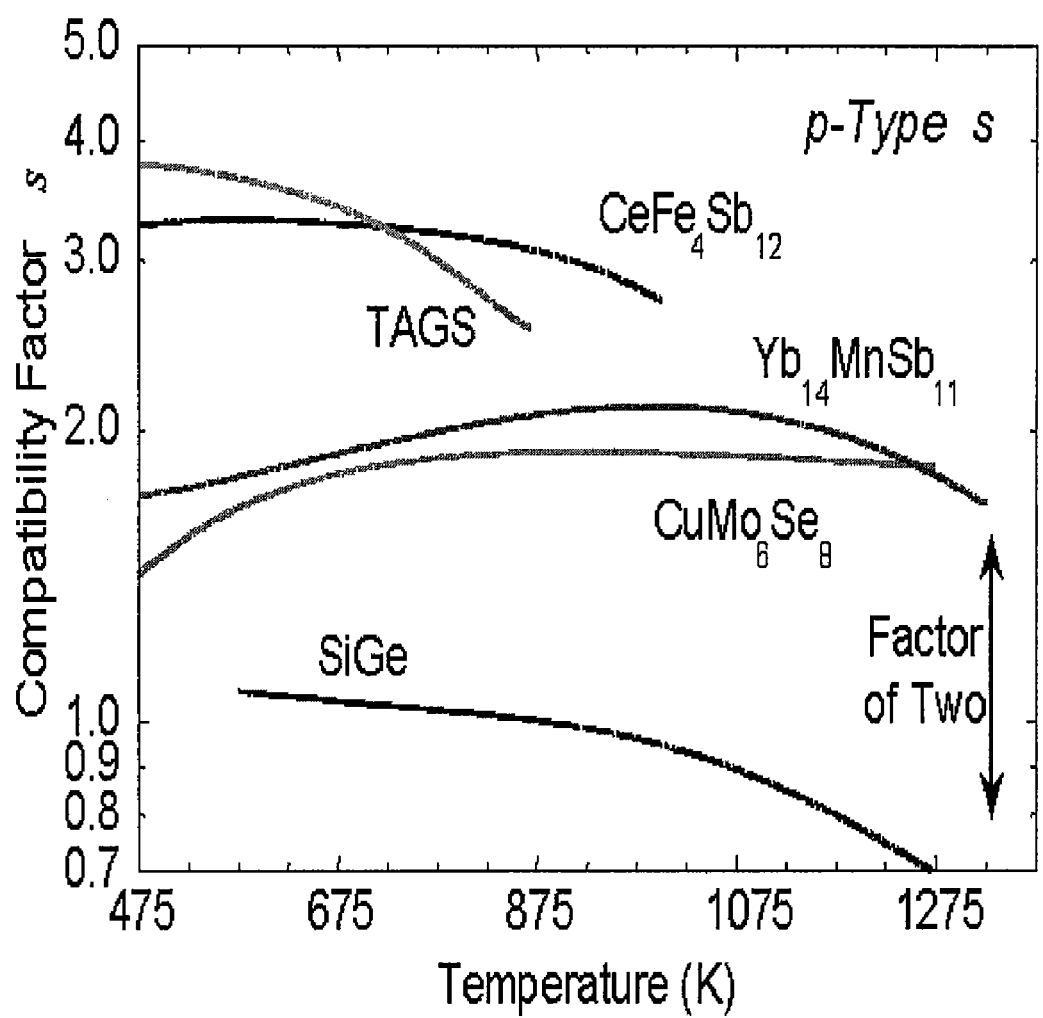
FIG. 3 shows a compatibility factor comparison plot for competitive compounds in accordance with an embodiment of the present invention. To maintain an efficiently operating device, the factor between two segmented materials is usually within 2.

To use the thermoelectric compounds for the applications disclosed herein, segmentation of materials is often useful in order to create an optimally performing thermoelectric device that is capable of operating over a large temperature range (300-1275 K). Segmentation of n- and p-type materials can allow for thermoelectric generators to be designed to span a wide range of temperatures. The highest zT materials up to 900 K, TAGS and the p-type skutterudite $CeFe_4Sb_{12}$ (FIG. 3) have compatibility factors of 3 $V^{-1}$-4 $V^{-1}$. Compared to the compatibility factor of the current state-of-the-art material (SiGe with $s<1$ $V^{-1}$), the ternary antimonide Zintl phase presented herein, results in a larger factor (2 $V^{-1}$), and therefore a more efficient system.

When segmenting materials for high efficiency, large temperature difference applications, the thermoelectric compatibility factors ($s=[(1+zT)^{1/2}-1]/\alpha T$) of the materials need to be considered because of the constraint that the same electrical current and similar heat must flow through each segment (G. J. Snyder, *Applied Physics Letters* 84:2436-2438, 2004). If the compatibility factors differ (by more than about a factor of two) not all the segments can generate power efficiently, such that the overall efficiency may be substantially less than that predicted from the average zT. This is particularly a problem for high temperature p-type segments where the state-of-the-art high temperature material, SiGe alloy, has a much lower compatibility factor than the other good p-type materials (as previously mentioned), making it incompatible for segmentation.

The Zintl phase compounds may be used in a variety of thermoelectric devices. Thermoelectric devices as described herein, comprise a p-phase semiconductor material, an n-phase semiconductor material, a heat element, and a cold element. U.S. Pat. No. 6,660,926 describes a number of suitable different thermoelectric devices and is therefore incorporated by reference in its entirety.

Figure 4:
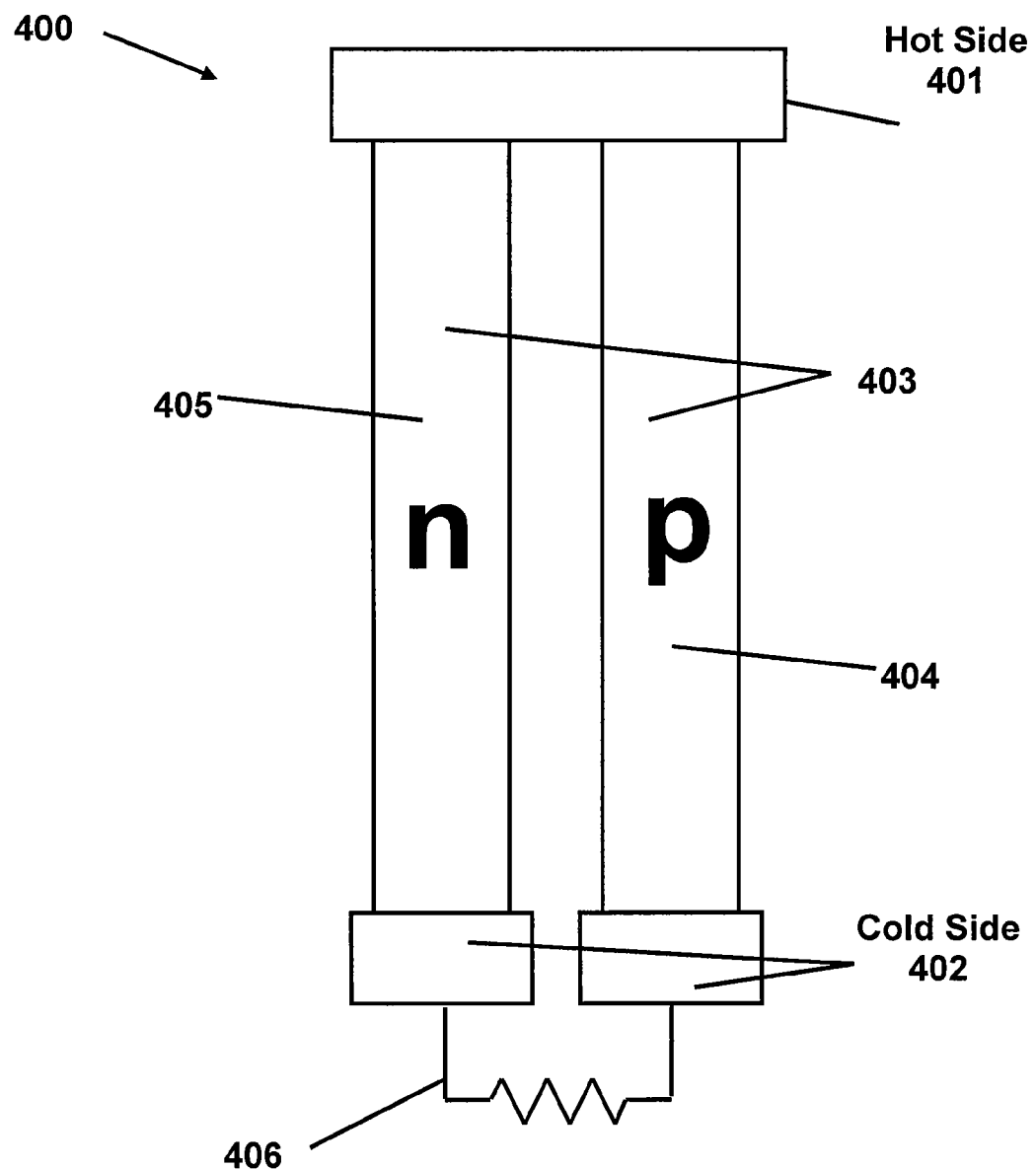
FIG. 4 shows a thermoelectric power generator in accordance with an embodiment of the present invention.

FIG. 4 shows a schematic of a thermoelectric power generator 400 that may be used to produce an electric current. The generator has a "hot" side that is in part defined by a plate or substrate 401 and a "cold" side that is in part defined by a plate or substrate 402. Plates 401 and 402 may be made of ceramic materials that are electrical insulators, although other suitable materials will be readily recognized by those of skill in the art. At least one thermoelectric element 403 is sandwiched between the plates 401 and 402. Each element has at least one p-type Zintl material (p-leg) as disclosed herein 404, and one n-type semiconducting material 405. The n-type semiconducting material (n-leg) may be any suitable material. The piece 404 and the piece 405 are directly connected with each other electrically on one side and indirectly connected with each other through other thermoelectric elements and the circuit 406 on the other side.

Two or more adjacent thermoelectric elements may be electrically connected in series, i.e., a p-type piece 404 of one element is directly connected to a n-type piece 405 of a neighboring element or vice versa. The hot side (plate 402) is in contact with a heat source of high temperature $T_h$. The cold side (plate 401) is in contact with a heat dumper of low temperature $T_c<T_h$. The temperature gradient from the hot side to the cold side induces the carriers in the thermoelectric pieces 404 and 405 move away from the hot side and towards the cold side. An electrical current is thus generated in each thermoelectric element in a direction from the n-type piece 405 to the p-type piece 404. The electrical power generation is increased by increasing the temperature difference and by using Zintl-type materials.

Figure 5:
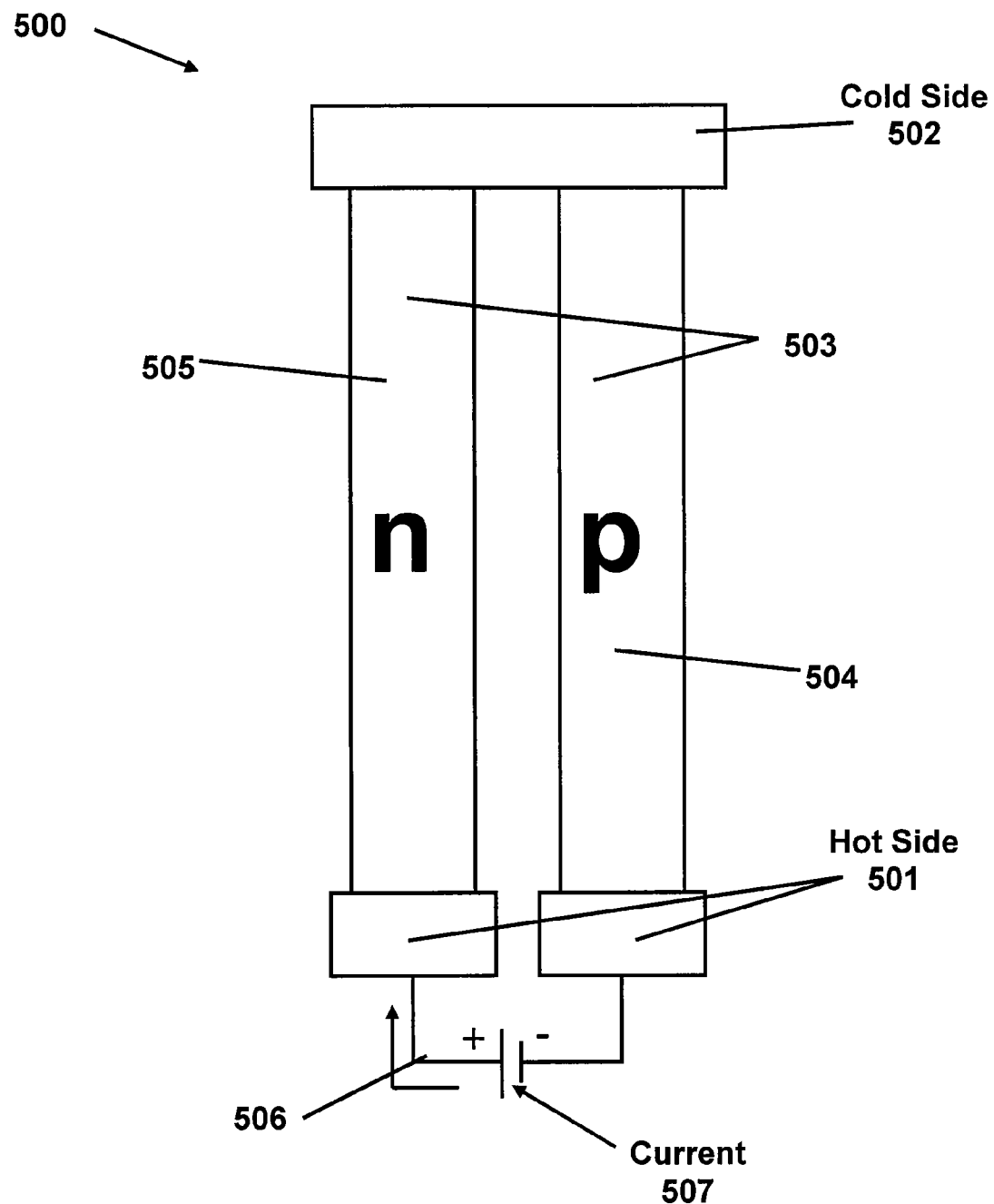
FIG. 5 shows a thermoelectric cooling device in accordance with an embodiment of the present invention.

FIG. 5 shows a schematic of a thermoelectric cooler 500 that uses the Zintl compounds disclosed herein in accordance with the present invention. The cooler 500 has a hot side that is in part defined by a plate or substrate 501 and a cold side that is in part defined by a plate or substrate 502. At least one thermoelectric element 503 is sandwiched between the plates 501 and 502. The p-type Zintl material 504 and the n-type Zintl material 505 may be directly connected with each other electrically on one side and indirectly connected with each other through other thermoelectric elements and the circuit on the other side. Two adjacent thermoelectric elements 503 may be electrically connected in series, i.e., a p-type piece 504 of one element is directly connected to a n-type piece 505 of a neighboring element or vice versa.

The cooler 500 may have a DC circuit 506 to electrically connect all thermoelectric elements. The circuit 506 may have its negative side connected with a p-type piece 504 on the hot side (plate 502) and the positive side connected with a n-type piece, also on the hot side (plate 502). A DC power supply 507 may send an electrical current to flow through all the thermoelectric elements in series with its direction in each element from the n-type piece 505 to the p-type piece 504. The holes in the p-type piece 504 move in the direction of the current and the electrons in the n-type piece 505 moves against the direction of the current. Therefore, the electrical current from the DC power supply 507 may impel both holes and the electrons move away from the cold side (plate 502) and towards the hot side (plate 502). The thermal energy of the cold side (plate 502) are thus transferred to the hot side (plate 501) by the holes and electrons. As a result, the heat of the cold side (plate 502) is "pumped" and dumped to the hot side (plate 501). A maximal cooling efficiency is achieved by minimizing the temperature difference between the hot side and cold side and importantly by using Zintl materials with large ZT values.

Figure 6:
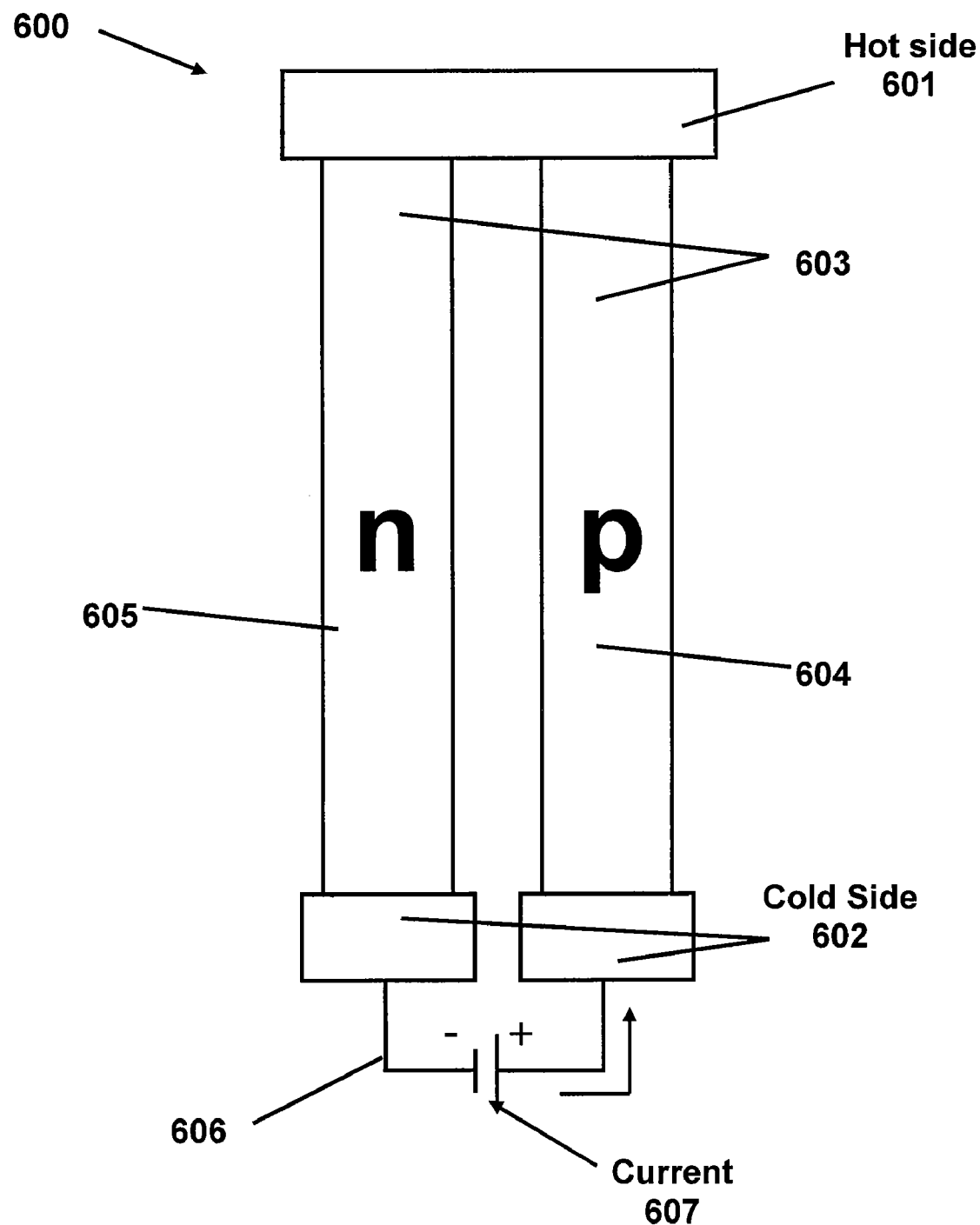
FIG. 6 shows a thermoelectric heating device in accordance with an embodiment of the present invention.

FIG. 6 shows a schematic of a thermoelectric heater 600 that uses Zintl-type materials as the p-type semiconducting material in accordance with the present invention. The heater 600 is similar to the cooler 500 in structure but the hot side and the cold side are exchanged. The driving electrical current in each thermoelectric element of the heater 600 flows from the p-type piece 604 to the n-type piece 605, opposite to the current direction in the cooler 500. The heat of the cold side is transferred to the hot side for heating.

Figure 7:
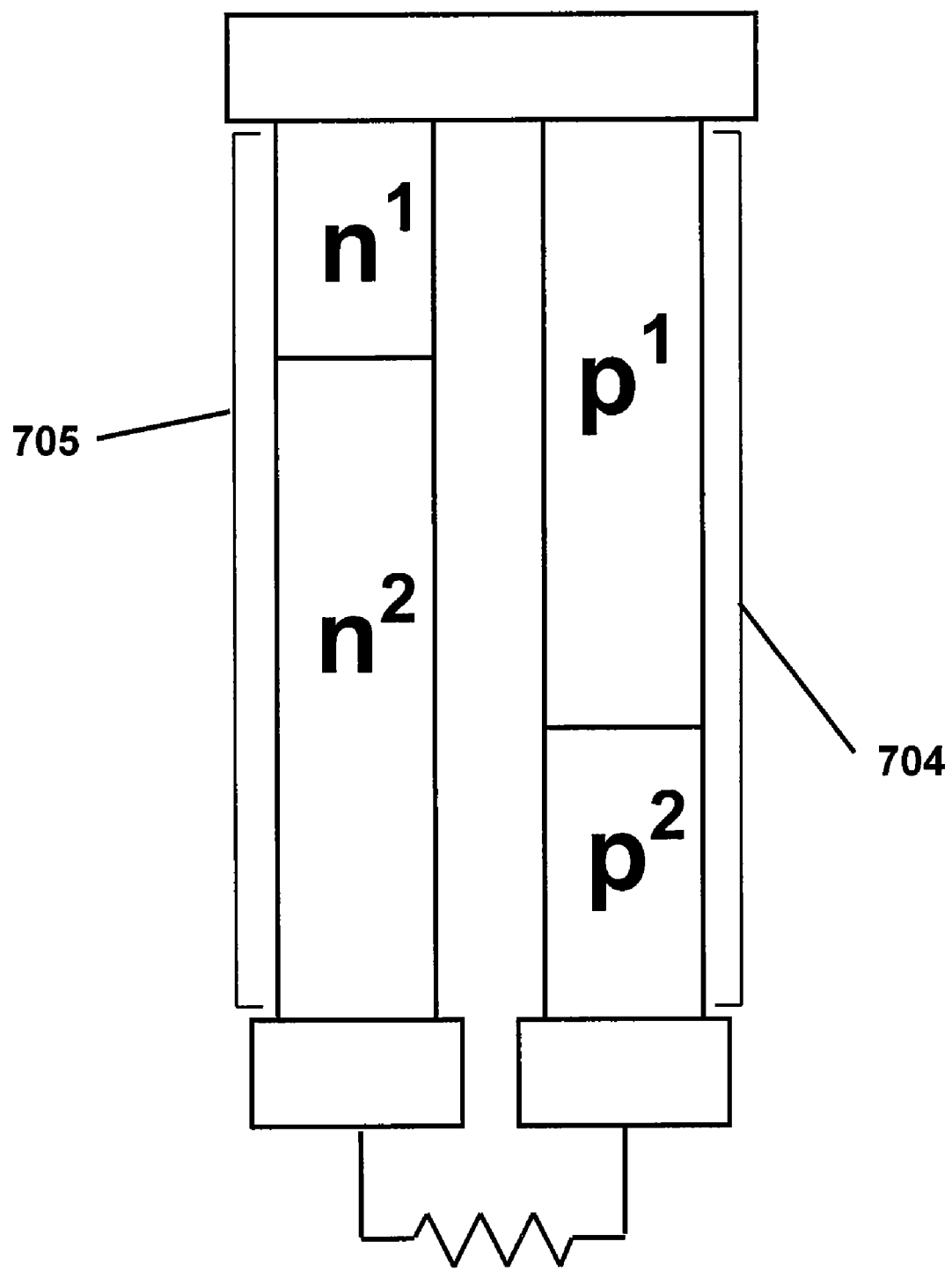
FIG. 7 shows a segmented thermoelectric generator in accordance with an embodiment of the present invention.

FIG. 7 shows a schematic for a segmented thermoelectric generator 700 using segmented p-legs and n-legs. Snyder (*App Phys Letters* 84:2436-2438, 2004) describes a variety of segmented thermoelectric generators and is incorporated herein by reference. A segmented thermoelectric device comprises the same components as the device shown in FIG. 4, except that the n-leg 705 and/or the p-leg 704 may comprise more than one thermoelectric material. For example, in FIG. 7, two different thermoelectric p-type materials, designated $p^1$ and $p^2$, are depicted. Also, two different thermoelectric n-type materials, designated $n^1$ and $n^2$, are depicted The Zintl-type materials disclosed herein may also be used in thermoelectric sensing applications. The inventors of the present invention also contemplate that the Zintl-type materials of either n-type or p-type can be used in combination with other kinds of thermoelectric materials in a thermoelectric device. For example, a n-type filled skutterudite material in accordance with the present invention can be used as the n-leg of a thermoelectric device while another p-type material such as TAGS can serve as the p-leg of the device. Such combination may be used to meet the requirements of some specific applications.

The following examples are provided to better illustrate the claimed invention and are not to be interpreted as limiting the scope of the invention. To the extent that specific materials are mentioned, it is merely for purposes of illustration and is not intended to limit the invention. One skilled in the art may develop equivalent means or reactants without the exercise of inventive capacity and without departing from the scope of the invention.

EXAMPLES

Materials and Methods

The following materials and methods were used in the Examples disclosed below.

Method 1: Single-Crystal Synthesis of $Yb_{14}MnSb_{11}$ and $Yb_{14}ZnSb_{11}$

All materials were handled in a nitrogen-filled drybox with water levels below 1.0 ppm. Sublimed dendritic Yb metal (obtained from Alfa Aesar, 99.99%; Ward Hill, Mass.) was cut into small pieces and used as received. Mn chips (Alfa Aesar, 99.98%) were ground into a powder. Zn powder (Fisher, 9.4%), Sb chunks (obtained from Allied Chemical, 99.7%; Hollywood, Fla.), and Sn granules (obtained from Mallinkrodt, 99.967%; Hazelwood, Mo.) were used as received. Both of the $Yb_{14}MSb_{11}$ (M=Mn, Zn) were prepared by way of a Sn-flux that has been previously published (I. R. Fisher et al., *Physical Review B: Condensed Matter and Materials Physics* 59:13829-13834, 1999; A. P. Holm et al., *Journal of Solid State Chemistry* 178:262-269, 2005; P. C. Canfield and Z. Fisk, *Philosophical Magazine B. Physics of Condensed Matter: Statistical Mechanics, Electronic, Optical and Magnetic Properties* 65:1117-23, 1992). The elements, Yb:Mn:Sb:Sn and Yb:Zn:Sb:Sn were arranged in 2 cc and 5 cc $Al_2O_3$ crucibles in the ratios 14:6:11:86. The reactions were sealed in quartz ampoules under ⅕ atm argon atmosphere and place in high temperature programmable furnaces. The reactions were brought up to 1100° C. following the heating procedure by Fisher et al. in 1999 (I. R. Fisher et al., *Physical Review B: Condensed Matter and Materials Physics* 59:13829-13834, 1999). Once at 1100° C. the reactions were held for 1 hour, and then cooled to temperatures between 700-800° C. at a rate of 2-3° C./h. Upon reaching final temperatures, the reactions were inverted and spun in a centrifuge at 6500 rpm for 3-5 minutes to separate the Sn-flux from the single-crystal products.

High yields of reflective, silver colored single-crystal ingots ($Yb_{14}MnSb_{11}$) and rods ($Yb_{14}ZnSb_{11}$) were obtained. All reactions were opened and examined in a nitrogen drybox equipped with a microscope and water levels below 1.0 ppm.

Method 2: X-Ray Powder Diffraction

While in a nitrogen-filled drybox, $Yb_{14}MnSb_{11}$ and $Yb_{14}ZnSb_{11}$ crystals were inspected, ground into a fine powder, and placed in an air-sensitive sample holder. Phase identification was completed by way of X-ray powder diffraction (XRD) using an Inel diffractometer, XRG 3000 (CuKα$_I$ radiation), which utilizes a stationary detector and is operated at 30 mA and 30 kV.

X-ray powder diffraction patterns were acquired from 0-120° 2-Theta at a 10° incident angle for 2500 seconds. The obtained data was analyzed and refined using the crystal structure database, MDI JADE 6.

Method 3: Differential Scanning Calorimetry and Thermogravimetry Measurements (DSC/TG)

A Netzsch Thermal Analysis STA 409 cell, equipped with a TASC 414/2 controller and PU 1.851.01 power unit was used to evaluate the thermal properties of $Yb_{14}MnSb_{11}$ and $Yb_{14}ZnSb_{11}$ between 298-1373 K. After a baseline was established, single crystals (30-50 mg) were placed in BN crucibles and heated at 10 K/min under a vacuum (30 in Hg) environment with an acquisition rate of 2.0 pts/K. Data were acquired using the software provided with the instrument. Analysis was performed using the computer program, Netzsch Proteus Analysis.

Method 3: Thermoelectric Properties Sample Preparation

In order to obtain a dense sample, the finely ground polycrystalline powder of $Yb_{14}MnSb_{11}$ or $Yb_{14}ZnSb_{11}$ was hot-pressed in high-density graphite dies (POCO). A cylinder about 6.5 mm long and 12 mm in diameter was thus obtained. Its density (calculated from measured dimensions and weight) was found to be about 95% of the theoretical density. The hot-pressing was conducted at a pressure of about 20,000 psi and at 1223 K for 1.5 hours under argon atmosphere.

Samples in the form of discs (typically 1 mm thick and 12 mm diameter slice) were cut from the cylinder using a diamond saw for electrical and thermal transport properties, while the Seebeck coefficient measurement was performed on the remaining cylinder. All these physical properties were measured between room temperature and 1273 K.

Method 5: Measurement of Resistivity

The electrical resistivity (p) was measured using the van der Pauw technique with a current of 100 mA using a special high temperature apparatus (J. A. McCormack and J. P. Fleurial, *Materials Research Society Symposium Proceedings* 234:135-43, 1991). The Hall coefficient was measured in the same apparatus with a forward and reverse magnetic field value of about 10,100 Gauss. The carrier density was calculated from the Hall coefficient ($R_H$) assuming a scattering factor of 1.0 in a single carrier scheme, by $n=1/R_H e$, where n is the densities of charge carriers (holes), and e the charge of the electron. The Hall mobility ($\mu_H$) was calculated from the Hall coefficient and the resistivity values with $u_H=R_H/\rho$. Data was measured to 1200 K and extrapolated to 1300 K.

Method 6: Measurement of Thermal Conductivity

The thermal diffusivity were measured for several samples using a flash diffusivity technique (J. W. Vandersande et al., *Thermal Conductivity* 19:445-52, 1988). The heat capacity was estimated using the model of Dulong and Petit $Cp=3$ k for each atom. The thermal conductivity (λ) was then calculated from the calculated heat capacity, experimental density, and experimental thermal diffusivity values. Data was measured to 1223 K and extrapolated to 1300 K.

Method 7: Seebeck Coefficient

The Seebeck coefficient (α) was measured using a high temperature light pulse technique using W/Nb thermocouples (C. Wood et al., *Review of Scientific Instruments* 56:719-22, 1985).

Method 8: Efficiency Calculations

Exact, optimized, single p-leg efficiencies were calculated according to Snyder (G. J. Snyder, *Applied Physics Letters* 84:2436-2438, 2004).

Example 1

Figure 8A:
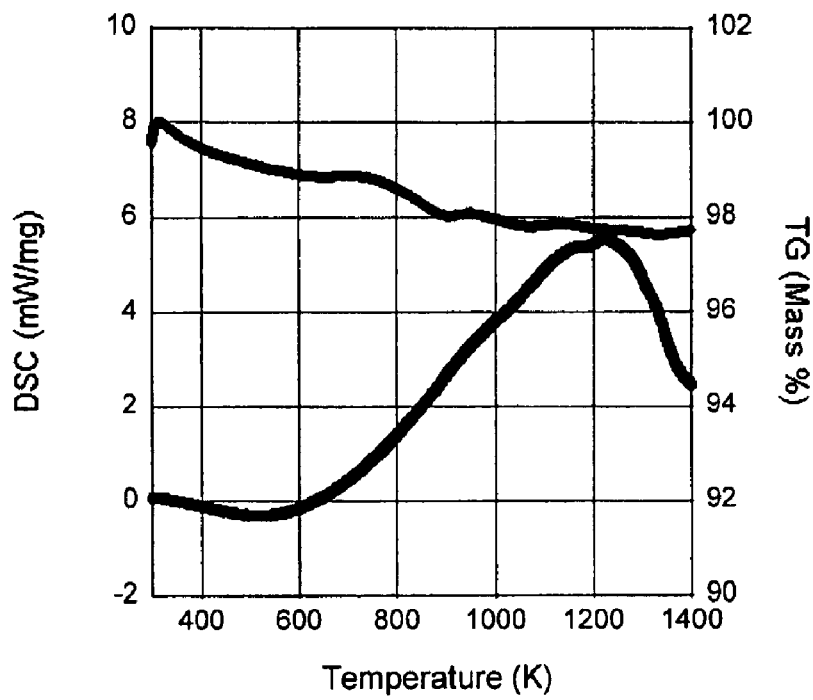
FIG. 8A shows a Differential scanning calorimetry and thermogravimetry (DSC/TG) representation of Yb$_{14}$MnSb$_{11}$ in accordance with an embodiment of the present invention. The DSC/TG shows material stability to 1275 K.
Figure 8B:
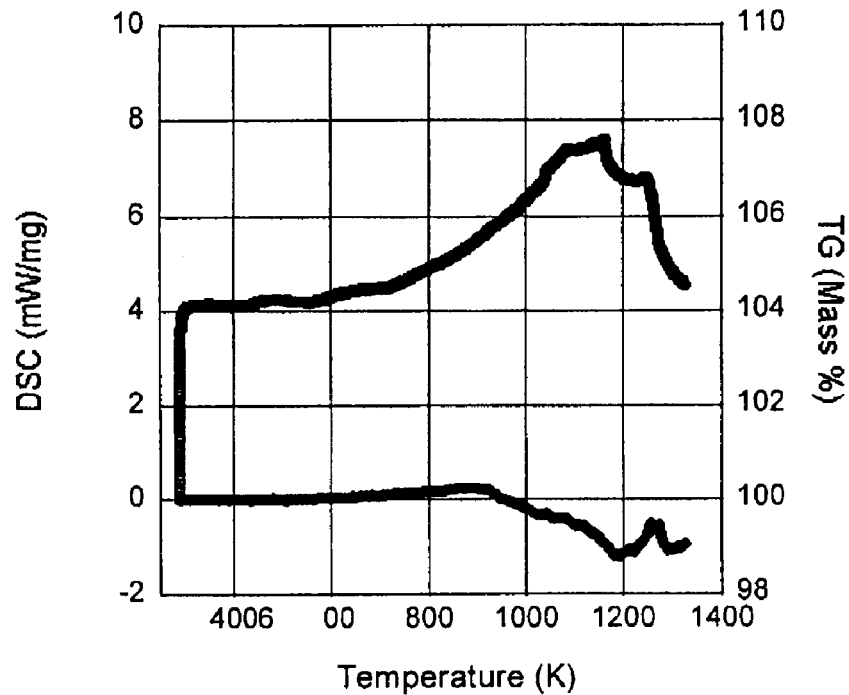
FIG. 8B shows a DSC/TG representation of Yb$_{14}$ZnSb$_{11}$ in accordance with an embodiment of the present invention. The DSC/TG shows material stability to 1275 K.

Measurement of High-Temperature Stability of $Yb_{14}MnSb_{11}$ and $Yb_{14}ZnSb_{11}$ Differential scanning calorimetry and thermogravimetry (DSC/TG) results indicate that the compounds, $Yb_{14}MnSb_{11}$ and $Yb_{14}ZnSb_{11}$, are stable within the desired temperature range of 298-1275 K. FIGS. 8A and 8B are representations of DSC and TG measurements for $Yb_{14}MnSb_{11}$ and $Yb_{14}ZnSb_{11}$, respectively. The DSC data corresponds to the left axis (mW/mg) while the TG data corresponds to the right (Mass %). It is evident that both materials do not reach a melting point before 1275 K. For $Yb_{14}MnSb_{11}$, the DSC data reveals a ~5.5% mW/mg increase and the TG data reveals a ~2.2% weight lose, most likely attributed to a glass transition. The DSC measurement for $Yb_{14}ZnSb_{11}$ shows a ~4% mW/mg increase while the TG decreases by ~1%, possibly caused by a slight vaporization of the Zn.

Example 2

Figure 9A:
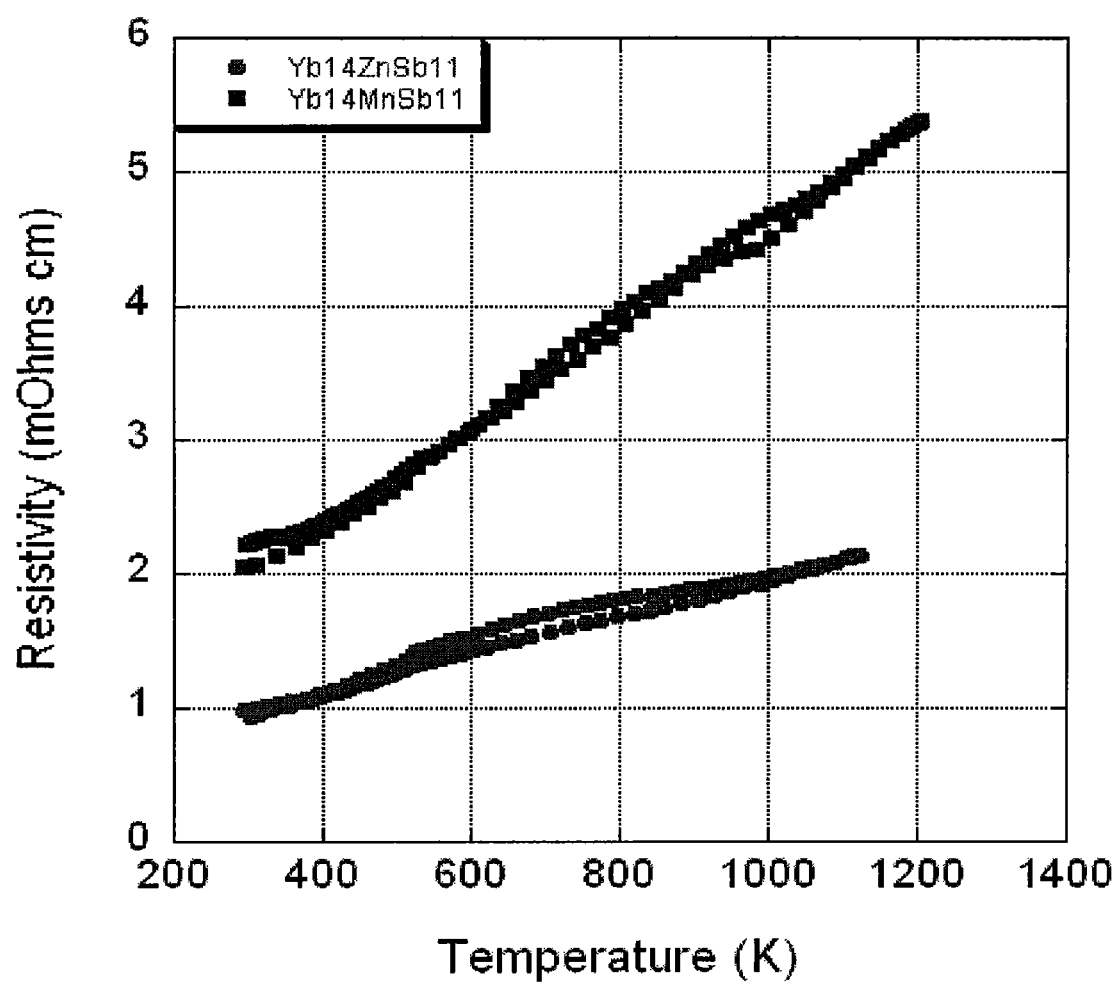
FIG. 9A shows a resistivity plot of Yb$_{14}$MnSb$_{11}$ and Yb$_{14}$ZnSb$_{11}$ in accordance with an embodiment of the present invention.
Figure 9B:
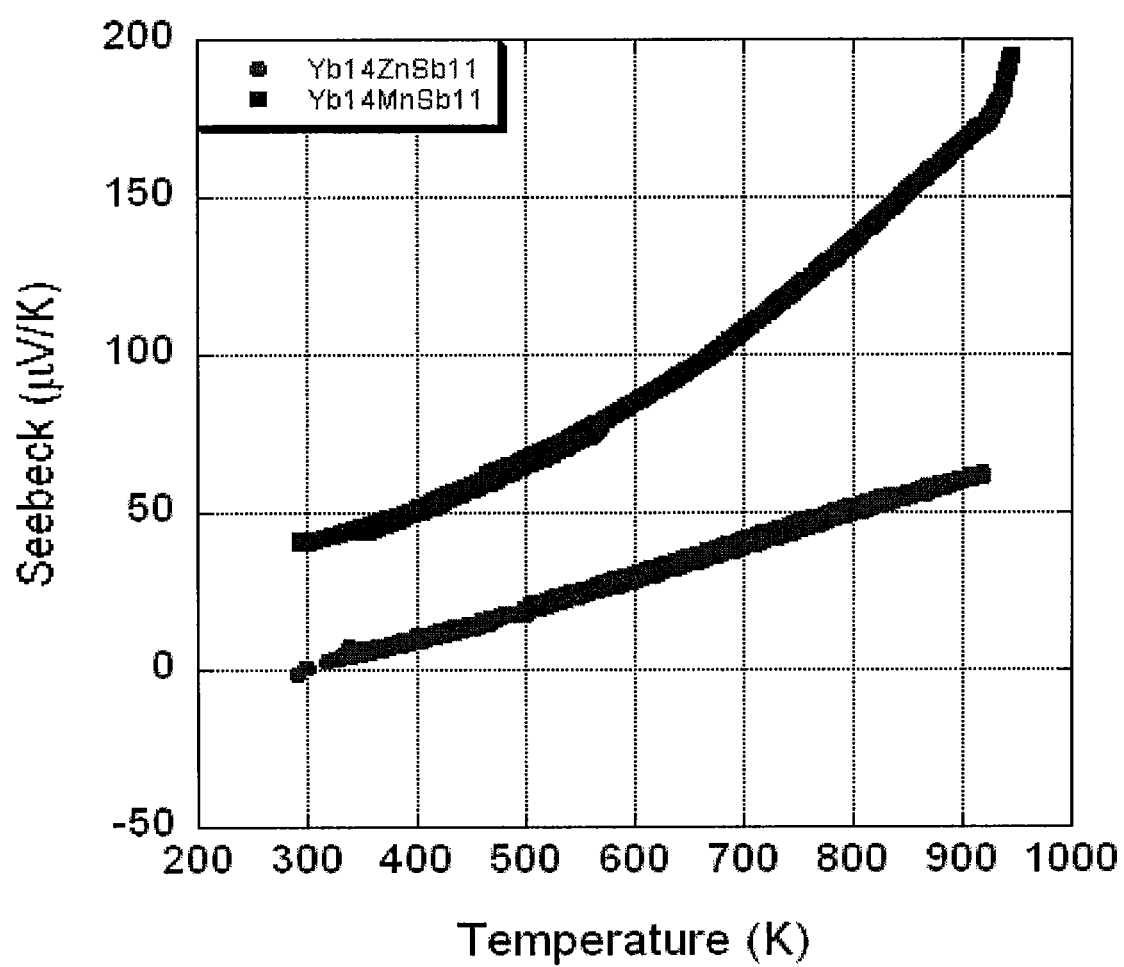
FIG. 9B shows a plot of the Seebeck coefficient versus temperature for Yb$_{14}$MnSb$_{11}$ and Yb$_{14}$ZnSb$_{11}$ in accordance with an embodiment of the present invention.

Measurement of Electronic Properties of $Yb_{14}MnSb_{11}$ and $Yb_{14}ZnSb_{11}$ The electronic properties (upon heating and cooling) for the hot-pressed pellets of the stoichiometric compositions $Yb_{14}MnSb_{11}$ and $Yb_{14}ZnSb_{11}$ are presented in FIGS. 9A and 9B. FIG. 9A shows that the resistivity linearly increases with increasing temperature and reaches approximately 5.4 mOhms cm at 1203 K for $Yb_{14}MnSb_{11}$, and 2.2 mOhms-cm for $Yb_{14}ZnSb_{11}$. The linear behavior is characteristic of a more metallic material rather than the traditional semiconducting behavior. These values are consistent with previously reported values of 1.2 mOhm-cm for $Yb_{14}MnSb_{11}$ and 1.0 mOhm-cm for $Yb_{14}ZnSb_{11}$ at 300K, and are typical for materials showing promising thermoelectric traits.

The Seebeck coefficient (thermopower) for $Yb_{14}MnSb_{11}$ and $Yb_{14}ZnSb_{11}$ shown in FIG. 9B reveal a positive increase with increasing temperature, indicating that the dominant carriers within the material are phonons (holes), indicating p-type behavior. The Seebeck values range from +60 to +185 μV/K ($Yb_{14}MnSb_{11}$) and 0 to +62 μV/K ($Yb_{14}ZnSb_{11}$) between the temperatures of 300-1275 K. The $Yb_{14}ZnSb_{11}$ data continuously increases in a linear fashion with increasing temperatures, leaving potential for a higher Seebeck value.

Example 3

Figure 9C:
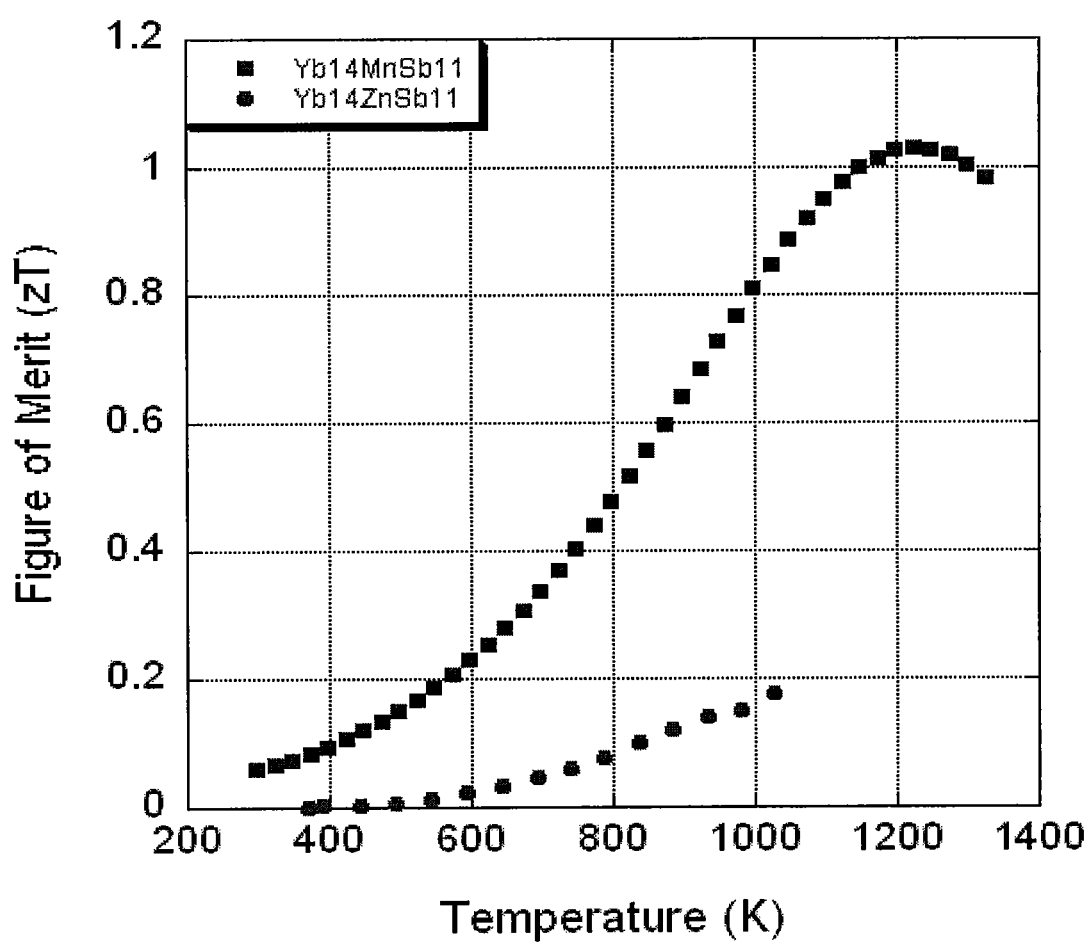
FIG. 9C a plot of the Figure of Merit versus temperature for Yb$_{14}$MnSb$_{11}$ and Yb$_{14}$ZnSb$_{11}$ in accordance with an embodiment of the present invention.

Measurement of Thermal Conductivity of $Yb_{14}MnSb_{11}$ and $Yb_{14}ZnSb_{11}$ The thermal conductivity data for $Yb_{14}MnSb_{11}$ and $Yb_{14}ZnSb_{11}$ are shown in FIG. 9C and range between ~7.0-8.7 mW/cmK and ~12-14 mW/cmK, respectively, for temperatures of the range 300-1275 K. $Yb_{14}MnSb_{11}$, has a steadily downward sloping trend with increasing temperature to 900 K. Beyond 900 K, the slope decreases and a more consistent value of ~7.25 mW/cmK is achieved. For $Yb_{14}ZnSb_{11}$, the thermal conductivity remains constant in the temperature range of 400 K-1025 K.

'This exceptionally low thermal conductivity of the Yb$_{14}$MnSb$_{11}$ structure may originate because it is composed of pseudo-ionically connected components. This is quite different from the skutterudites and the clathrates because there is no covalent network. These pseudo-ionically connected components may provide a less rigid structure for lower thermal conductivity, perhaps similar to the Zn$_4$Sb$_3$, except that defects appear not to be playing a role (G. J. Snyder et al., Nature Materials 3:458-463, 2004). In addition, the low values can be attributed to the complexity and heavy atomic mass of the crystal since the crystal complexity limits the phonon mean-free path, and the heavy atomic mass reduces the fraction of atomic vibrational modes that carry heat efficiently within the system.

Figure 9D:
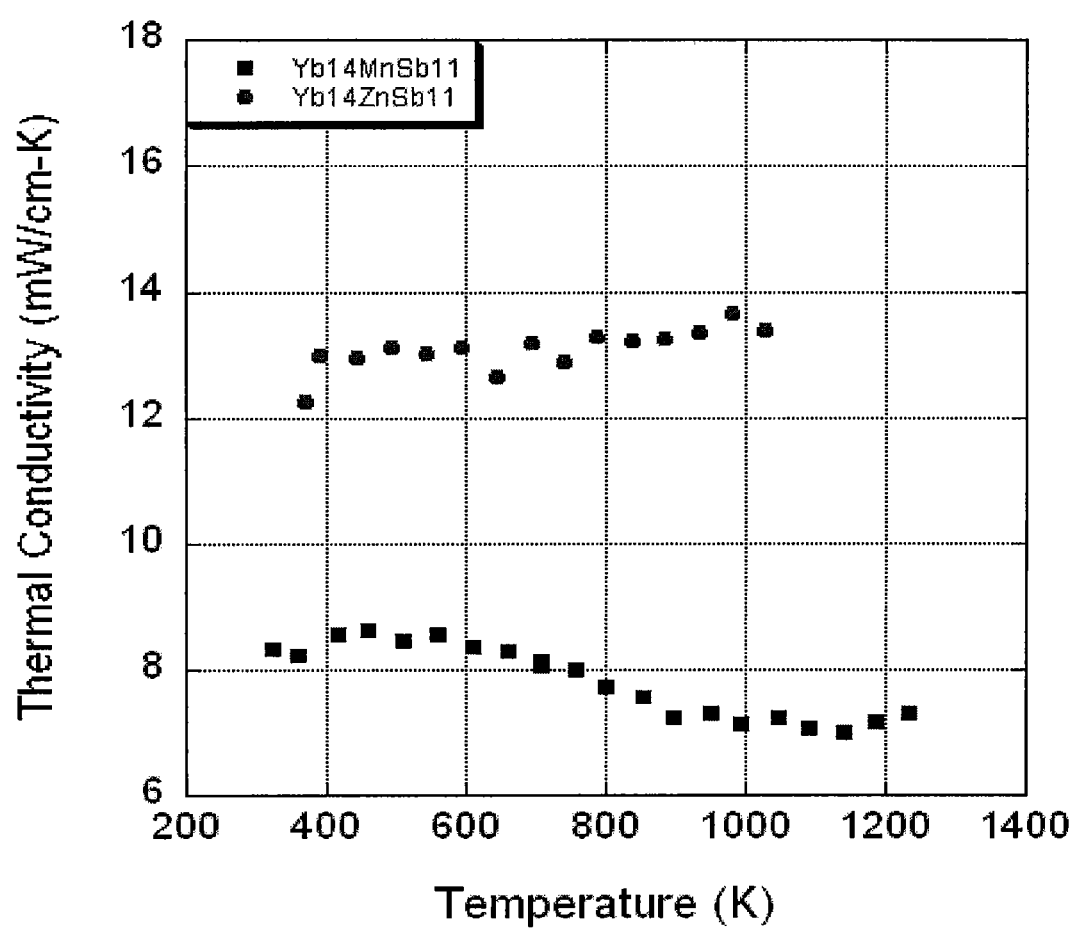
FIG. 9D a plot of the thermal conductivity versus temperature for Yb$_{14}$MnSb$_{11}$ and Yb$_{14}$ZnSb$_{11}$ in accordance with an embodiment of the present invention.

Combining the electrical and thermal properties of Yb$_{14}$MnSb$_{11}$ and Yb$_{14}$ZnSb$_{11}$, results in plots of the dimensionless figure of merit (zT) versus temperature (K). These calculations are represented by FIG. 9D for Yb$_{14}$MnSb$_{11}$ and Yb$_{14}$ZnSb$_{11}$, respectively. As anticipated, material efficiency for Yb$_{14}$MSb$_{11}$ (M=Mn, Zn) increases with increasing temperature and reaches maximum values of ~1.03 and ~0.18 at 1223 K, respectively. Approaching 1223 K, the figure of merit for Yb$_{14}$MnSb$_{11}$ reaches its maximum and "rolls over," quickly losing material efficiency. The figure of merit for Yb$_{14}$ZnSb$_{11}$, continuously increases in an exponential fashion with increasing temperatures and does not show an apparent roll over point, leaving potential for higher zT values to be achieved. Both figure of merit plots resemble the power factor plots for Yb$_{14}$MnSb$_{11}$ and Yb$_{14}$ZnSb$_{11}$, thus revealing the influential effect that the electrical properties hold for thermoelectric materials.

Yb$_{14}$MnSb$_{11}$ has exceptionally low thermal conductivity, and when this is taken into account, the overall figure of merit is large (FIG. 9D), illustrating that the thermoelectric properties of this compound is heavily dependent on its thermal properties. To date, the most widely used high-temperature thermoelectric materials are those of SiGe and its derivatives. FIG. 2 shows a comparison plot of the most competitive p-type materials, revealing the superiority of Yb$_{14}$MnSb$_{11}$ over SiGe. At elevated temperatures (>900 K) p-type SiGe reaches a maximum figure of merit of ~0.6 at 1100 K. The data for Yb$_{14}$MnSb$_{11}$ nearly doubles the zT value found for SiGe, improving the figure of merit by 67%.

Example 4

Figure 10A:
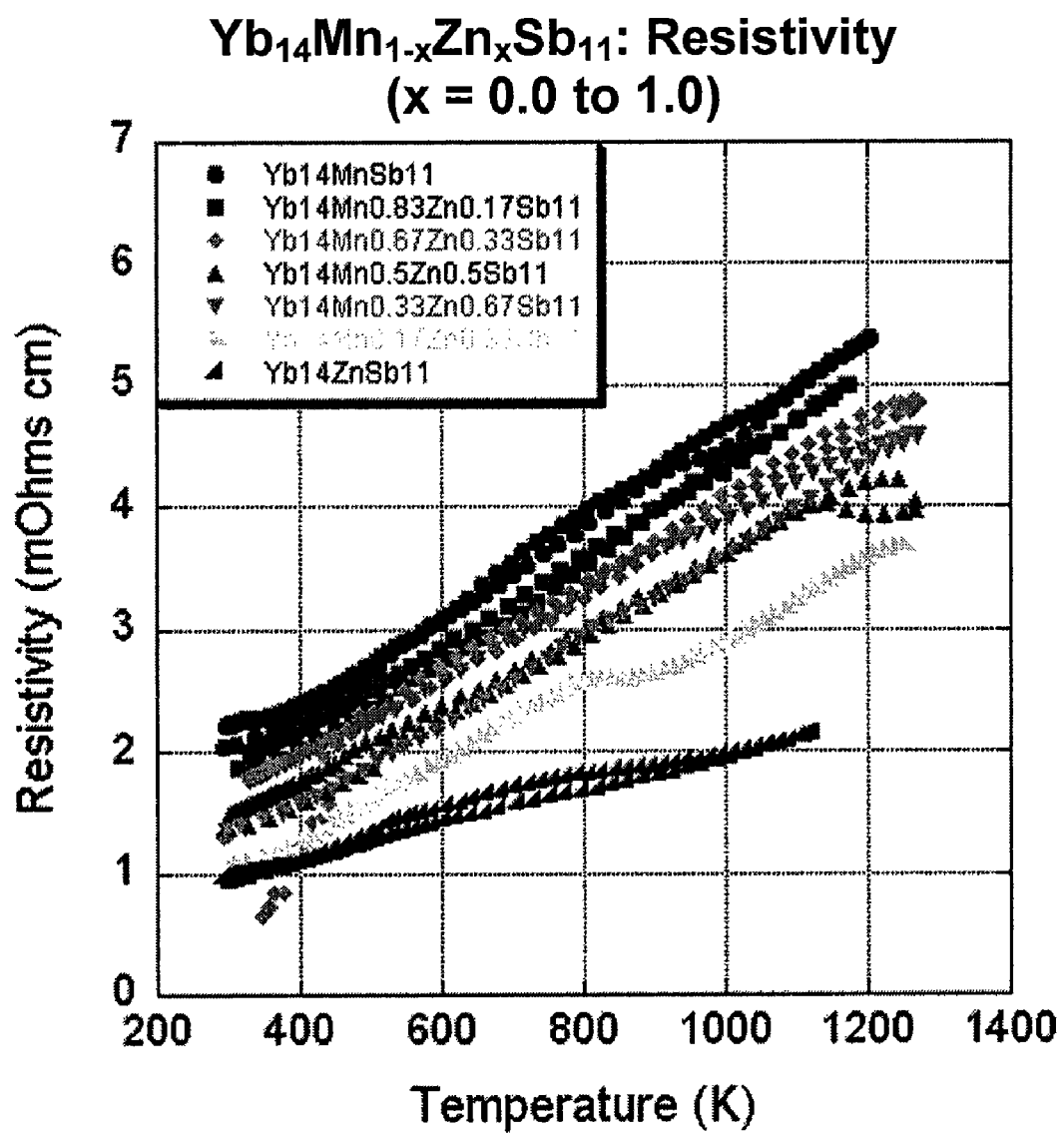
FIG. 10A shows a plot of the resistivity versus temperature for compounds having the formula Yb$_{14}$Mn$_{1-x}$Zn$_x$Sb$_{11}$ (x=0.0 to about 1.0) in accordance with an embodiment of the present invention.
Figure 10B:
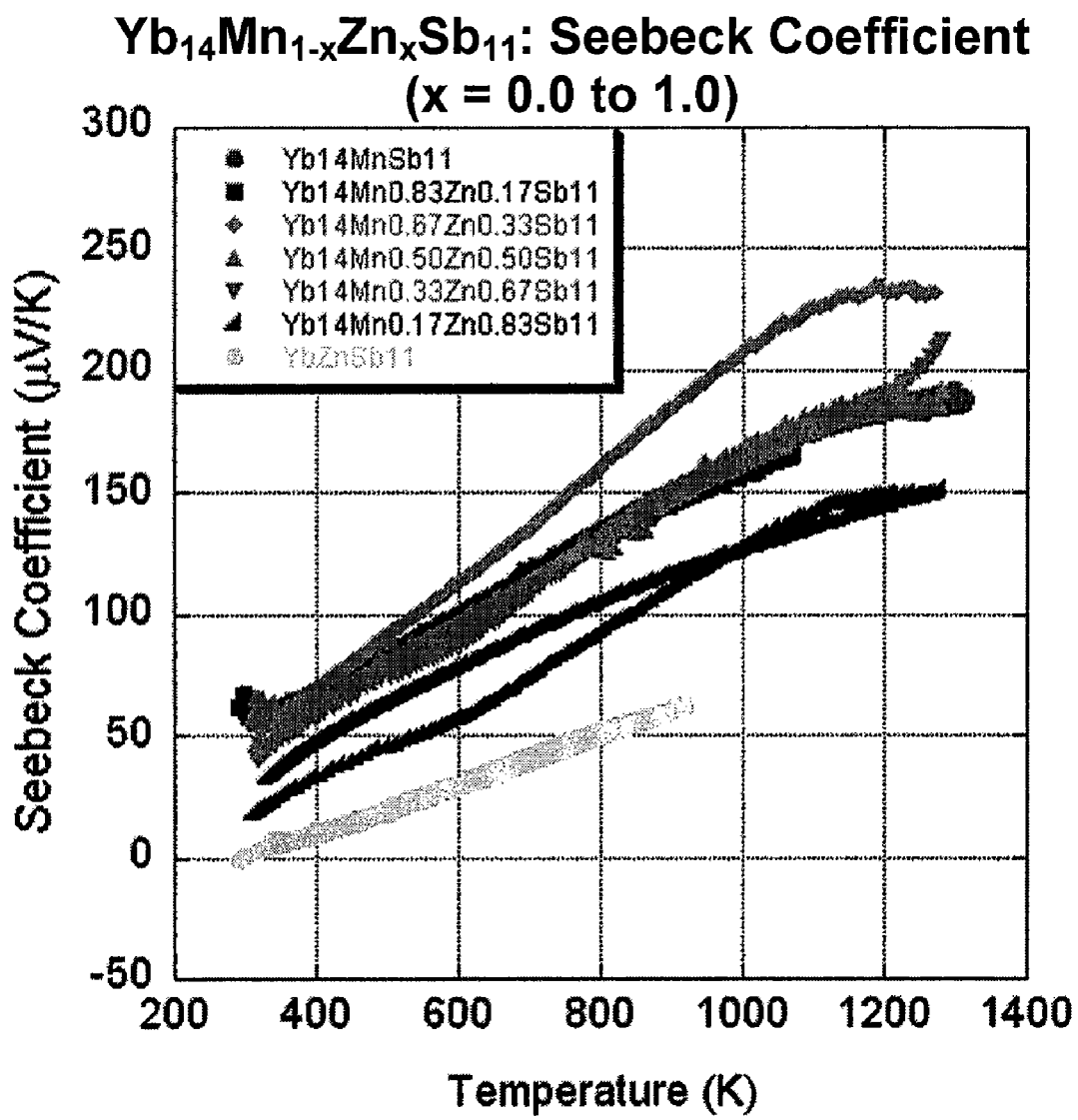
FIG. 10B shows a plot of the Seebeck coefficient versus temperature for compounds having the formula Yb$_{14}$Mn$_{1-x}$Zn$_x$Sb$_{11}$ (x=0.0 to about 1.0) in accordance with an embodiment of the present invention.
Figure 10C:
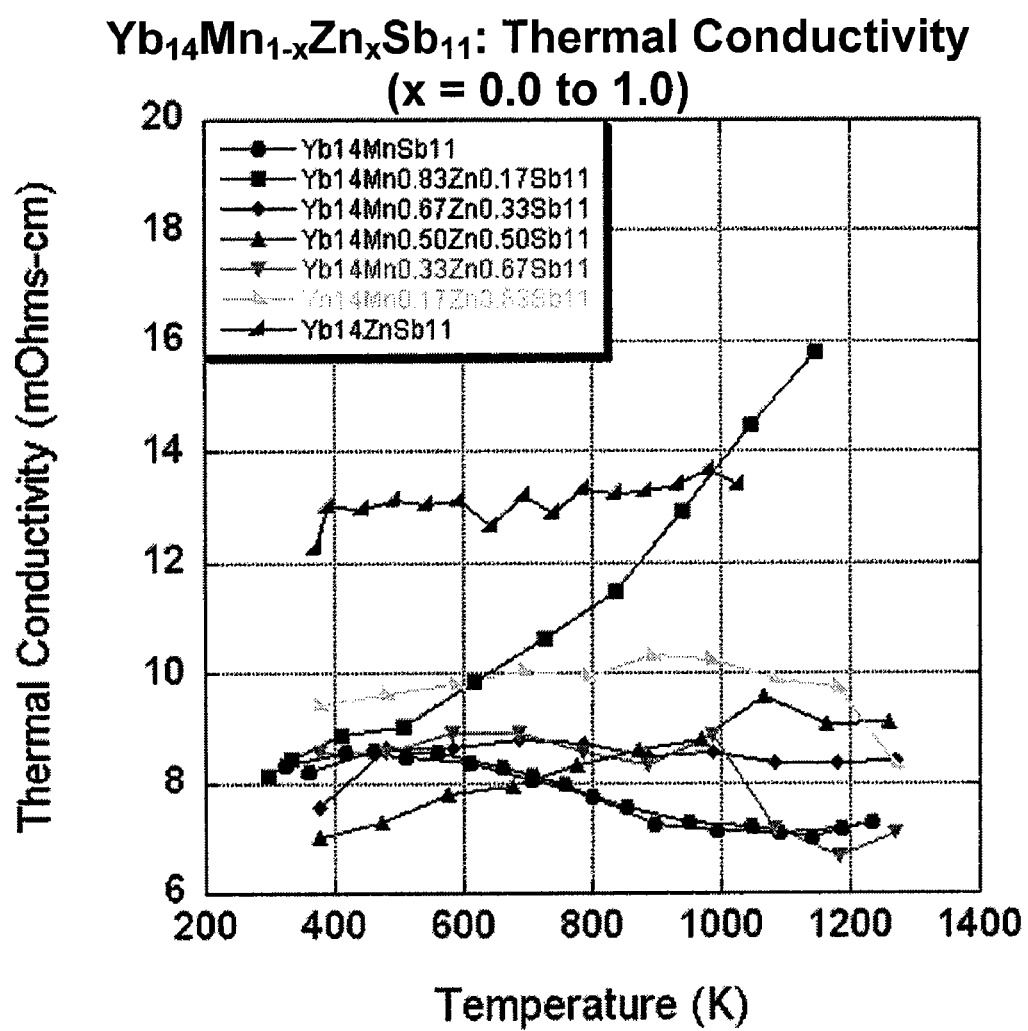
FIG. 10C shows a plot of thermal conductivity versus temperature for compounds having the formula Yb$_{14}$Mn$_{1-x}$Zn$_x$Sb$_{11}$ (x=0.0 to about 1.0) in accordance with an embodiment of the present invention.
Figure 10D:
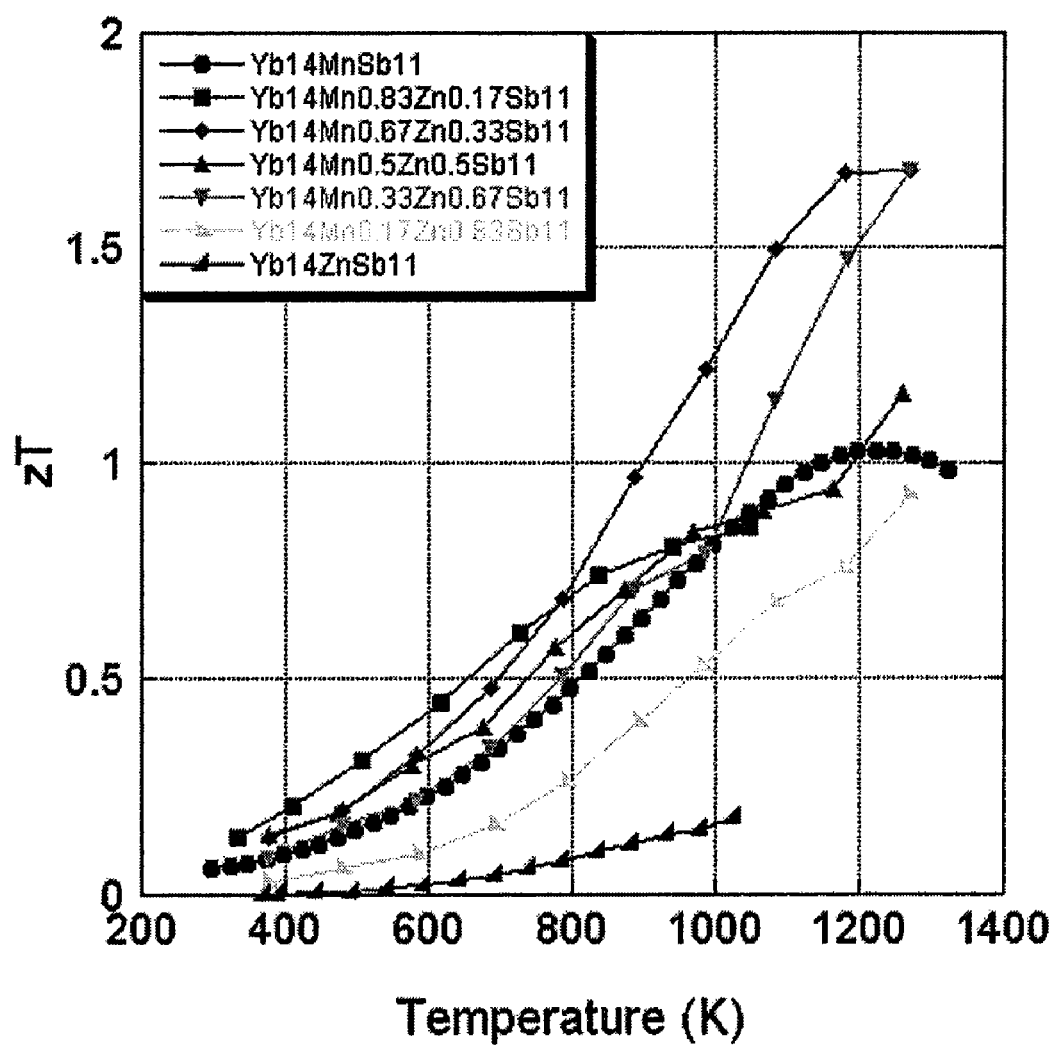
FIG. 10D shows a plot Figure of Merit versus temperature for compounds having the formula Yb$_{14}$Mn$_{1-x}$Zn$_x$Sb$_{11}$ (x=0.0 to about 1.0) in accordance with an embodiment of the present invention.

Measurement of Thermoelectric Properties of Zinc-Doped Compounds Having Formula III Utilizing the methods described above, resistivity (FIG. 10A), Seebeck coefficient (FIG. 10B), thermal conductivity (FIG. 10C), and figure of merit (FIG. 10D) were measured for compounds having the general formula III.

$$Yb_{14}Mn_{1-x}Zn_xSb_{11} \tag{III}$$

wherein x is from about 0.0 to about 1.0. Table 1 shows the crystal diffraction data for the compounds of formula (IV) shown in this Example.

TABLE 1

Crystal diffraction of Yb$_{14}$Mn$_{1-x}$Zn$_x$Sb$_{11}$ tetragonal crystal system.

| Stoichiometry | Unit Cell (Å) | Volume (Å$^3$) |
|---|---|---|
| Yb$_{14}$Mn$_{0.83}$Zn$_{0.17}$Sb$_{11}$ | a = 16.589<br>c = 21.9105 | 6030.24 |

TABLE 1-continued

Crystal diffraction of Yb$_{14}$Mn$_{1-x}$Zn$_x$Sb$_{11}$ tetragonal crystal system.

| Stoichiometry | Unit Cell (Å) | Volume (Å$^3$) |
|---|---|---|
| Yb$_{14}$Mn$_{0.67}$Zn$_{0.33}$Sb$_{11}$ | a = 16.5845<br>c = 21.9053 | 6024.96 |
| Yb$_{14}$Mn$_{0.50}$Zn$_{0.50}$Sb$_{11}$ | a = 16.5568<br>c = 21.8842 | 5999.06 |
| Yb$_{14}$Mn$_{0.33}$Zn$_{0.67}$Sb$_{11}$ | a = 16.5889<br>c = 21.8953 | 6025.44 |
| Yb$_{14}$Mn$_{0.17}$Zn$_{0.83}$Sb$_{11}$ | a = 16.5757<br>c = 21.8669 | 6008.02 |

Example 5

Figure 11A:
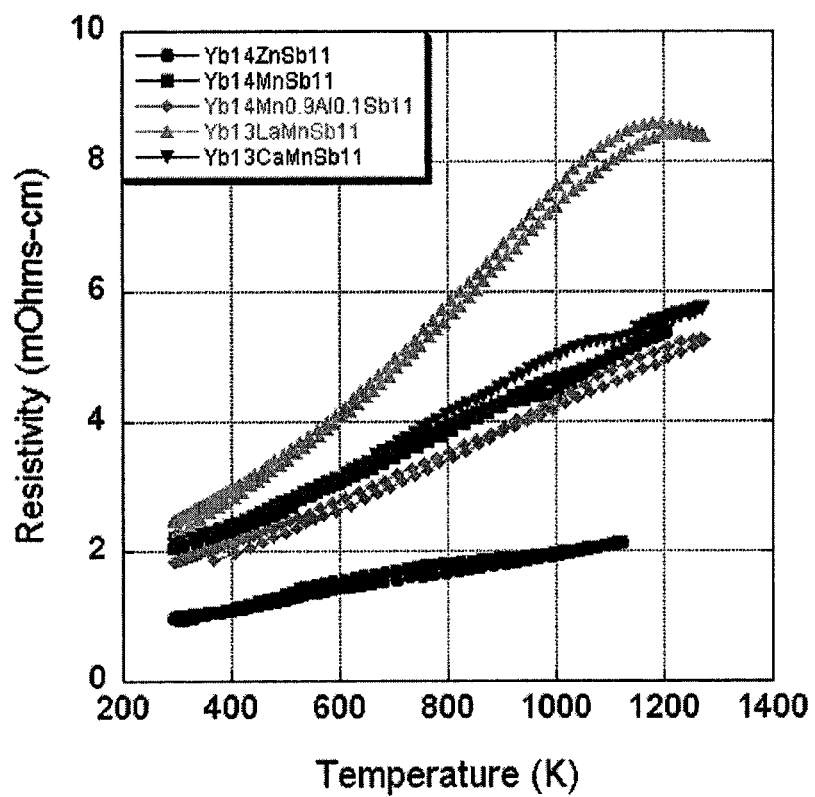
FIG. 11A shows a plot of resistivity versus temperature for compounds having the formula Yb$_{14-y}$A$_y$Mn$_{1-x}$MSb$_{11}$ (A=Ca, La, or Eu with x=0.0 to about 14.0; M=Al with x=0.0 to about 1.0) in accordance with an embodiment of the present invention.
Figure 11B:
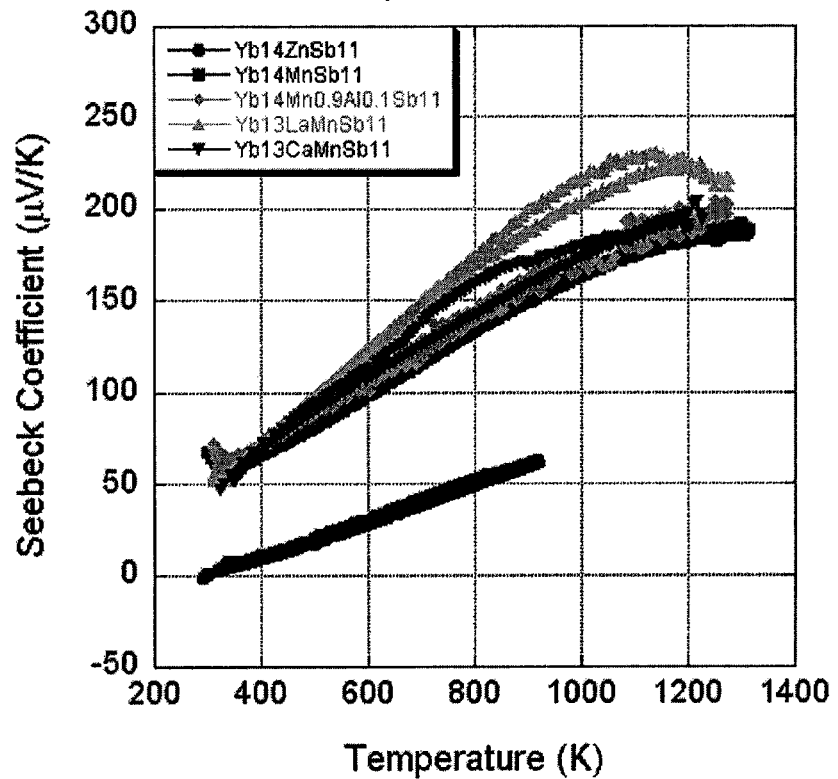
FIG. 11B shows a plot of Seebeck Coefficient for compounds having the formula $Yb_{14-y}A_yMn_{1-x}MSb_{11}$ (A=Ca, La, Eu with x=0.0 to about 14.0; M=Al with x=0.0 to about 1.0) in accordance with an embodiment of the present invention.
Figure 11C:
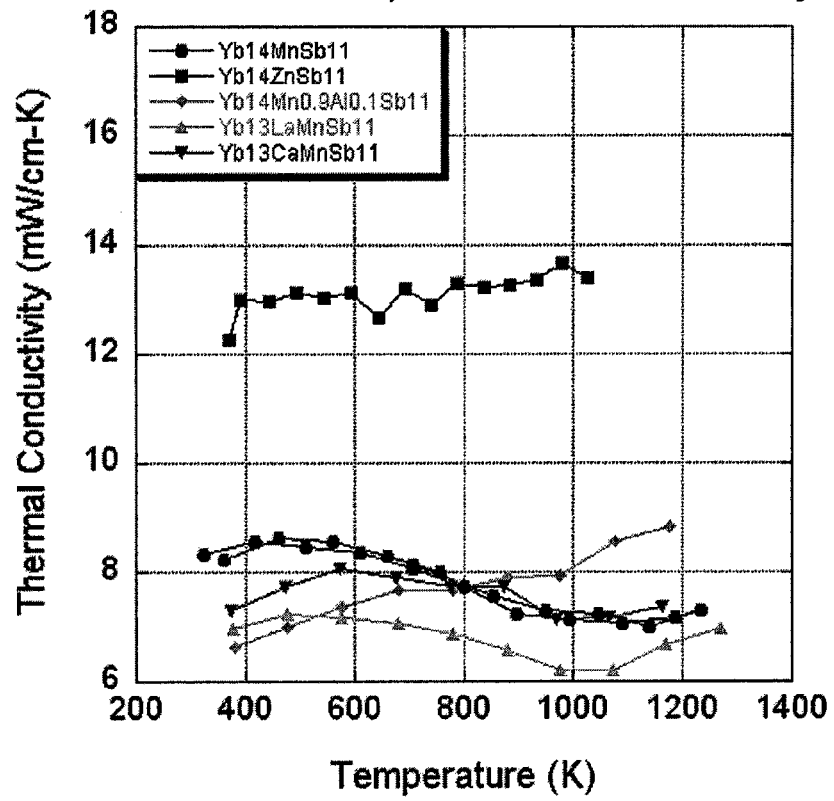
FIG. 11C shows a plot of thermal conductivity versus temperature for compounds having the formula $Yb_{14-y}A_yMn_{1-x}MSb_{11}$ (A=Ca, La, Eu with x=0.0 to about 14.0; M=Al with x=0.0 to about 1.0) in accordance with an embodiment of the present invention.
Figure 11D:
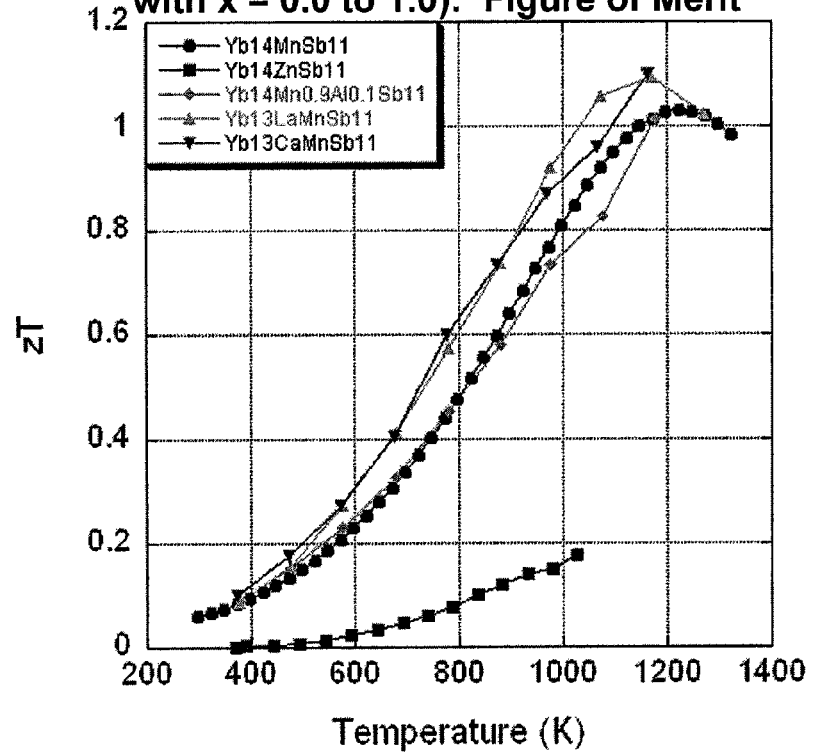
FIG. 11D shows a plot of Figure of Merit versus temperature for compounds having the formula $Yb_{14-y}A_yMn_{1-x}MSb_{11}$ (A=Ca, La, Eu with x=0.0 to about 14.0; M=Al with x=0.0 to about 1.0) in accordance with an embodiment of the present invention.

Measurement of Thermoelectric Properties of Calcium, Lanthanum, Europium, and Aluminum-Doped Compounds Having General Formula II Utilizing the methods described above, resistivity (FIG. 11A), Seebeck coefficient (FIG. 11B), thermal conductivity (FIG. 11C), and figure of merit (FIG. 11D) were measured for compounds having the general formula II.

$$Yb_{14-y}A'_yMn_{1-x}M'_xSb_{11} \tag{II}$$

wherein A' is calcium, lanthanum, or europium with y from about 0.0 to about 14.0 and M' is aluminum with x from about 0.0 to about 1.0. The compounds included in this Example were:

Yb$_{14}$ZnSb$_{11}$

Yb$_{14}$MnSb$_{11}$

Yb$_{14}$Mn$_{0.9}$Al$_{0.1}$Sb$_{11}$

Yb$_{13}$LaMnSb$_{11}$

Yb$_{13}$CaMnSb$_{11}$

Example 6

Figure 12A:
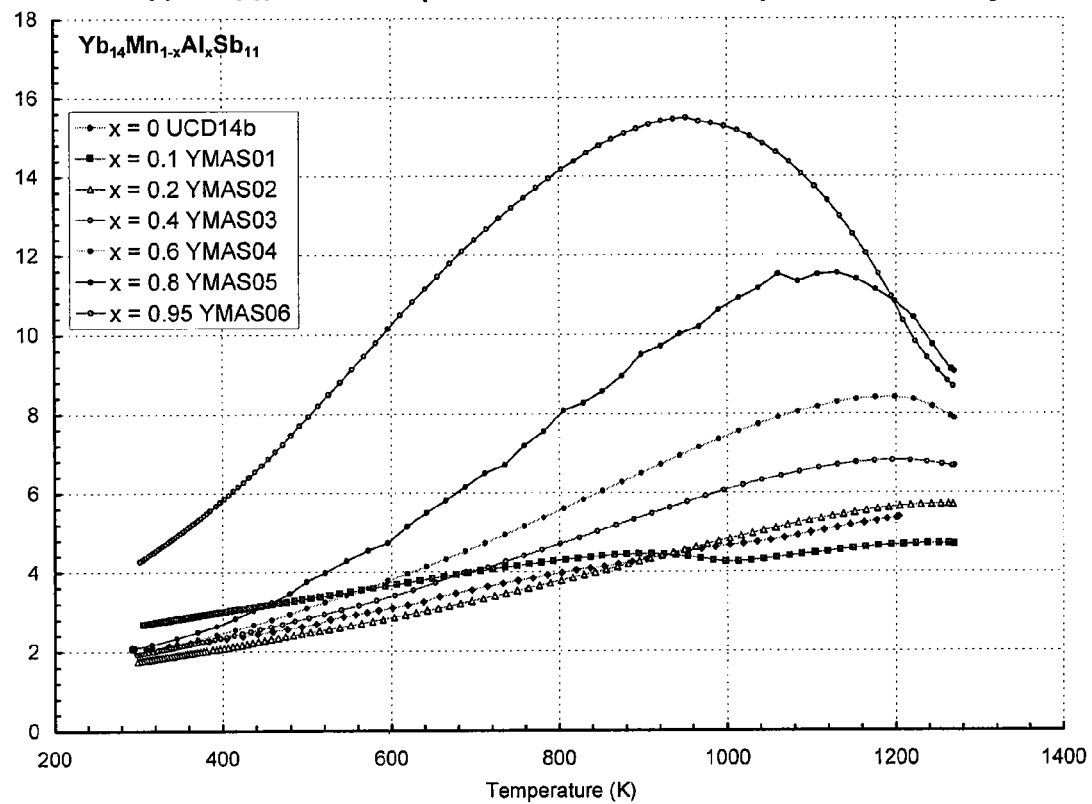
FIG. 12A shows a plot of resistivity versus temperature for compounds having the formula $Yb_{14}Mn_{1-x}Al_xSb_{11}$ (with x=0.0 to about 1.0) in accordance with an embodiment of the present invention.
Figure 12B:
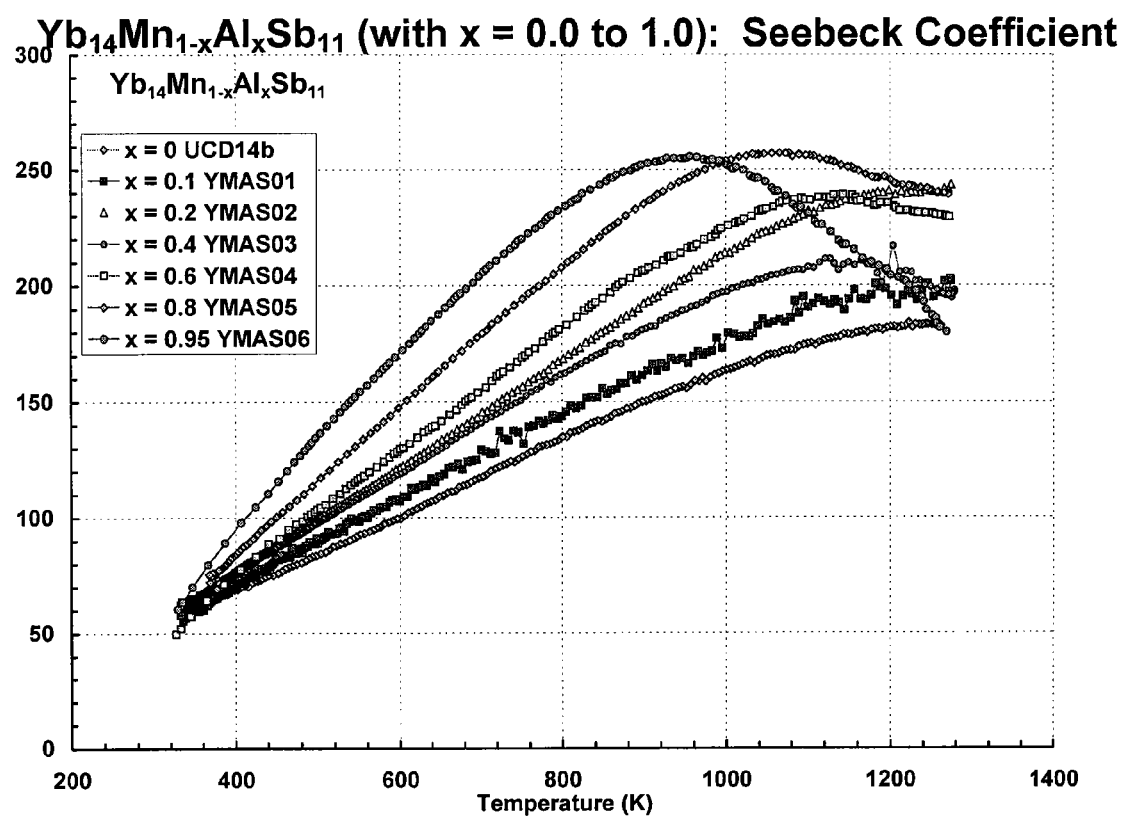
FIG. 12B shows a plot of Seebeck Coefficient for compounds having the formula $Yb_{14}Mn_{1-x}Al_xSb_{11}$ (with x=0.0 to about 1.0) in accordance with an embodiment of the present invention.
Figure 12C:
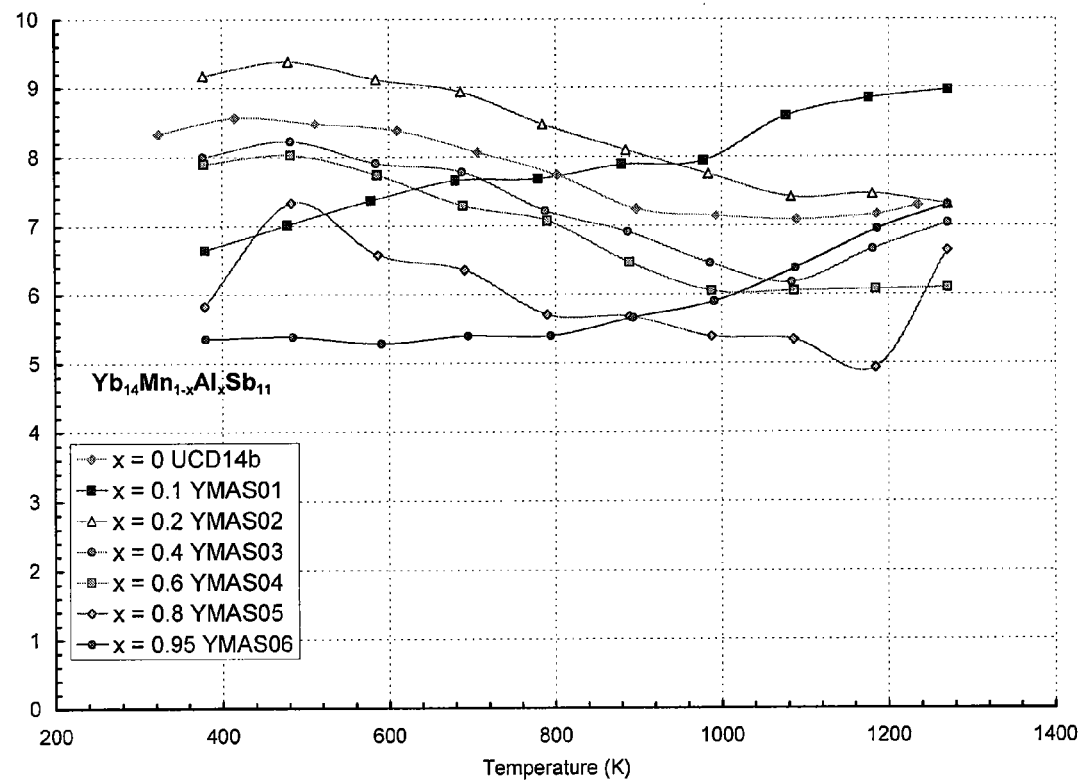
FIG. 12C shows a plot of thermal conductivity versus temperature for compounds having the formula $Yb_{14}Mn_{1-x}Al_xSb_{11}$ (with x=0.0 to about 1.0) in accordance with an embodiment of the present invention.
Figure 12D:
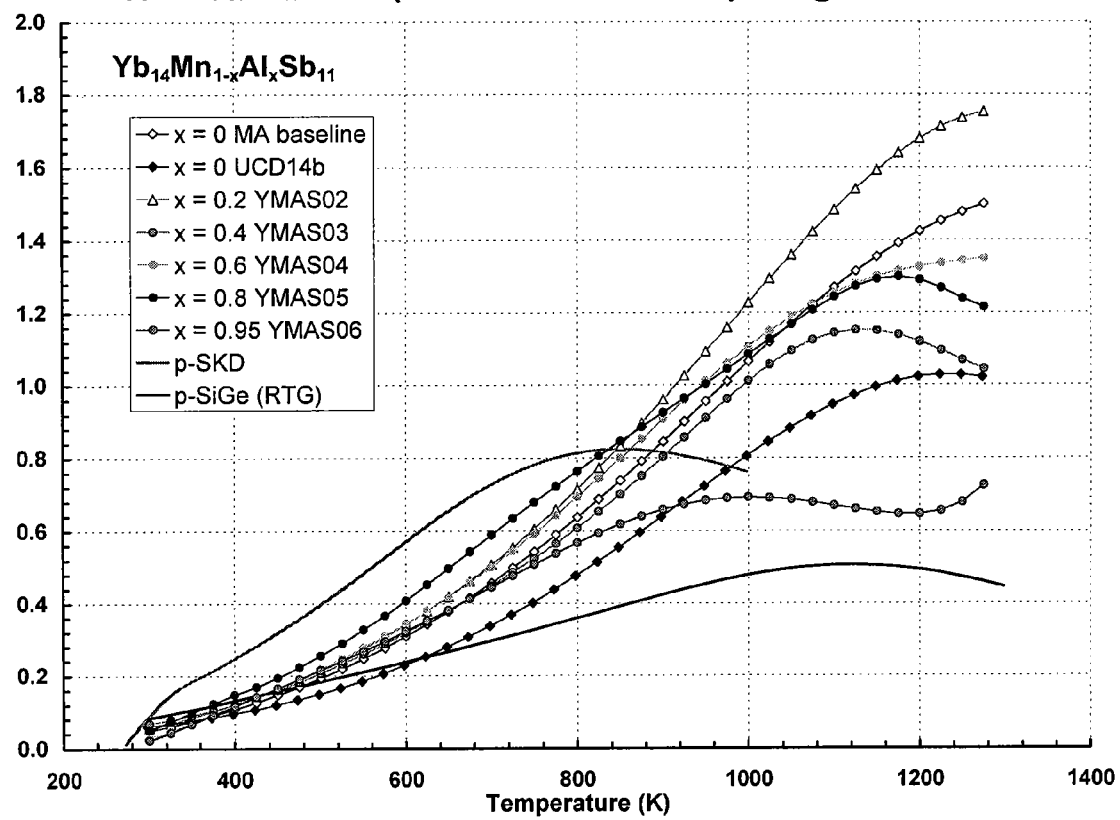
FIG. 12D shows a plot of Figure of Merit versus temperature for compounds having the formula $Yb_{14}Mn_{1-x}Al_xSb_{11}$ (with x=0.0 to about 1.0) in accordance with an embodiment of the present invention.

Measurement of Thermoelectric Properties of Calcium, Lanthanum, Europium, and Aluminum-Doped Compounds Having Formula IV Utilizing the methods described above, resistivity (FIG. 12A), Seebeck coefficient (FIG. 12B), thermal conductivity (FIG. 12C), and figure of merit (FIG. 12D) were measured for seven compounds having the general formula IV.

$$Yb_{14}Mn_{1-x}Al_xSb_{11} \tag{IV}$$

wherein x is from about 0.0 to about 1.0. The compounds included in this Example were:

Yb$_{14}$MnSb$_{11}$

Yb$_{14}$Mn$_{0.9}$Al$_{0.1}$Sb$_{11}$

Yb$_{14}$Mn$_{0.8}$Al$_{0.2}$Sb$_{11}$

Yb$_{14}$Mn$_{0.6}$Al$_{0.4}$Sb$_{11}$

Yb$_{14}$Mn$_{0.2}$Al$_{0.8}$Sb$_{11}$

Yb$_{14}$Mn$_{0.05}$Al$_{0.95}$Sb$_{11}$

While the description above refers to particular embodiments of the present invention, it will be understood that many modifications may be made without departing from the spirit thereof. The presently disclosed embodiments are therefore to be considered in all respects as illustrative and not restrictive. All publications, patents, and patent applications cited herein are hereby incorporated by reference in their entirety for all purposes.

The invention claimed is:

1. A thermoelectrically active p-type thermoelectric material comprising the general formula (II):

$$Yb_{14-y}A'_y Mn_{1-x}M'_x Sb_{11} \qquad (II),$$

wherein

A' is selected from the group consisting of calcium, europium, lanthanum, and combinations thereof;

M' is selected from the group consisting of zinc, aluminum, and combinations thereof;

y is from about 0.0 to about 14.0; and x is from about 0.0 to about 1.0, wherein x is larger than 0.0 and wherein Mn is present in the thermoelectric material.

2. The p-type thermoelectric material of claim 1, wherein the thermoelectric material has a thermoelectric figure of merit (zT) of at least about 0.6 and a thermoelectric power generation compatibility factor (s) of at least about 1 $V^{-1}$, at a temperature above about 898 K.

* * * * *